(12) United States Patent
Ogawa et al.

(10) Patent No.: US 12,300,683 B2
(45) Date of Patent: May 13, 2025

(54) DISPLAY DEVICE WITH STACKED WIRING AND DISPLAY DEVICE WITH TRANSLUCENT REGION

(71) Applicant: Japan Display Inc., Tokyo (JP)

(72) Inventors: Akihiro Ogawa, Tokyo (JP); Masanobu Ikeda, Tokyo (JP); Yasuhiro Kanaya, Tokyo (JP); Yoshinori Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 400 days.

(21) Appl. No.: 17/830,470

(22) Filed: Jun. 2, 2022

(65) Prior Publication Data

US 2022/0293579 A1 Sep. 15, 2022

Related U.S. Application Data

(63) Continuation of application No. PCT/JP2020/040721, filed on Oct. 29, 2020.

(30) Foreign Application Priority Data

Dec. 3, 2019 (JP) .................................. 2019-219148

(51) Int. Cl.
*H01L 25/16* (2023.01)
*H10D 86/40* (2025.01)
(Continued)

(52) U.S. Cl.
CPC ......... *H01L 25/167* (2013.01); *H10D 86/441* (2025.01); *H10D 86/60* (2025.01); *H10H 20/857* (2025.01)

(58) Field of Classification Search
CPC ..... H01L 25/167; H01L 27/124; H01L 33/62; H01L 33/44; H01L 25/0753;
(Continued)

(56) References Cited

U.S. PATENT DOCUMENTS 6,753,654 B2 * 6/2004 Koyama .............. G09G 3/3208
315/169.3
6,771,028 B1 8/2004 Winters
(Continued)

FOREIGN PATENT DOCUMENTS

CN 102573164 A 7/2012
JP 2002-278513 A 9/2002
(Continued)

OTHER PUBLICATIONS

International Search Report issued in International Patent Application No. PCT/JP2020/040721 on Jan. 26, 2021 and English translation of same. 7 pages.

(Continued)

*Primary Examiner* — Duy T Nguyen
(74) *Attorney, Agent, or Firm* — K&L Gates LLP

(57) ABSTRACT

A display device includes a substrate, a first light-emitting diode (LED) element and a second LED element provided to the substrate and configured to output light, a first signal line provided between the first LED element and the second LED element and electrically coupled to the first LED element, a second signal line provided between the first LED element and the second LED element and electrically coupled to the second LED element, gate wiring intersecting the first signal line and the second signal line, and anode wiring overlapping the gate wiring and electrically coupled to the first LED element and the second LED element. The anode wiring extends parallel to the gate wiring.

16 Claims, 17 Drawing Sheets

(51) Int. Cl.
*H10D 86/60* (2025.01)
*H10H 20/857* (2025.01)

(58) Field of Classification Search
CPC ... H01L 27/1255; H01L 27/1248; G09F 9/30; G09F 9/33; H10D 86/441; H10D 86/60; H10D 86/451; H10D 86/481; H10H 20/857; H10H 20/84
USPC .......................................................... 257/72
See application file for complete search history.

(56) References Cited

U.S. PATENT DOCUMENTS

| | | | |
|---|---|---|---|
| 2006/0022587 A1* | 2/2006 | Jeong | H10K 59/122 |
| | | | 313/504 |
| 2008/0067570 A1 | 3/2008 | Yamashita et al. | |
| 2008/0218455 A1* | 9/2008 | Yamamoto | G09G 3/325 |
| | | | 345/76 |
| 2009/0140253 A1 | 6/2009 | Kasahara | |
| 2012/0012853 A1 | 1/2012 | Kasahara | |
| 2012/0074409 A1 | 3/2012 | Matsumoto et al. | |
| 2013/0050067 A1 | 2/2013 | Yamashita et al. | |
| 2014/0175449 A1 | 6/2014 | Kasahara | |
| 2017/0053971 A1 | 2/2017 | Sato | |
| 2017/0213502 A1 | 7/2017 | Henry et al. | |
| 2018/0061855 A1* | 3/2018 | Min | H10D 86/411 |
| 2018/0069056 A1 | 3/2018 | Sato | |
| 2018/0342565 A1 | 11/2018 | Cheng | |
| 2019/0043933 A1 | 2/2019 | Sato | |
| 2019/0057987 A1* | 2/2019 | Kao | H10D 86/0231 |
| 2019/0164502 A1 | 5/2019 | Yoon et al. | |

FOREIGN PATENT DOCUMENTS

| | | | | |
|---|---|---|---|---|
| JP | 2004-334204 A | | 11/2004 | |
| JP | 2006-267847 A | | 10/2006 | |
| JP | 2007-188047 A | | 7/2007 | |
| JP | 2008-227057 A | | 9/2008 | |
| JP | 2010-160526 A | | 7/2010 | |
| JP | 2013044890 A | * | 3/2013 | ......... H01L 27/0688 |
| JP | 2017-040876 A | | 2/2017 | |
| JP | 2017-529557 A | | 10/2017 | |
| JP | 2018-185544 A | | 11/2018 | |
| JP | 2018-198166 A | | 12/2018 | |

OTHER PUBLICATIONS

Written Opinion issued in International Patent Application No. PCT/JP2020/040721 on Jan. 26, 2021. 4 pages.

Office Action issued in related Chinese Patent Application No. 202080083573.9 dated Jun. 30, 2023 and English translation of same. 21 pages.

Office Action issued in related Japanese Patent Application No. 2023-125441 mailed Mar. 5, 2024, and English translation of same. 7 pages.

* cited by examiner

DISPLAY DEVICE WITH STACKED WIRING AND DISPLAY DEVICE WITH TRANSLUCENT REGION

CROSS-REFERENCE TO RELATED APPLICATION

This application is a continuation of International Patent Application No. PCT/JP2020/040721 filed on Oct. 29, 2020 which designates the United States, incorporated herein by reference, and which claims the benefit of priority from Japanese Patent Application No. 2019-219148 filed on Dec. 3, 2019, incorporated herein by reference.

BACKGROUND

1. Technical Field

The present disclosure relates to a display device.

2. Description of the Related Art

Displays including micro-sized light-emitting diodes (micro LEDs) as display elements have recently been attracting attention (refer to Published Japanese Translation of PCT Application No. 2017-529557 (JP-A-2017-529557), for example). The LEDs are coupled to an array substrate (driver backplane in JP-A-2017-529557), and the array substrate includes pixel circuits (electronic control circuits in JP-A-2017-529557) that drive the LEDs. Japanese Patent Application Laid-open Publication No. 2002-278513 describes pixel circuits that drive organic electroluminescent (EL) elements by an active matrix.

A display device what is called a transparent display (or transmissive display) is known, being used in a manner enabling one side of a screen can be seen through the screen from the other side. If LEDs are used as display elements for such transparent displays, the transmittance may possibly be reduced by a plurality of transistors, wiring, and other components constituting a drive circuit for the LEDs.

An object of the present disclosure is to provide a display device that enables visually recognizing, from a first surface of an array substrate, the background on a second surface side opposite to the first surface and that can suppress reduction in transmittance.

SUMMARY

A display device according to an embodiment of the present disclosure includes a substrate, a first light-emitting diode (LED) element and a second LED element provided to the substrate and configured to output light, a first signal line provided between the first LED element and the second LED element and electrically coupled to the first LED element, a second signal line provided between the first LED element and the second LED element and electrically coupled to the second LED element, gate wiring intersecting the first signal line and the second signal line, and anode wiring overlapping the gate wiring and electrically coupled to the first LED element and the second LED element. The anode wiring extends parallel to the gate wiring.

A display device according to an embodiment of the present disclosure includes a substrate, a plurality of pixels provided to the substrate, a plurality of light-emitting elements provided to the pixels and configured to output light, a plurality of transistors provided corresponding to the light-emitting elements, and a signal line and a gate line coupled to the transistors. A translucent region with an aperture ratio of 80% or higher and a non-translucent region with an aperture ratio of lower than 80% are adjacently formed in a first direction, and a length of the translucent region in the first direction is five or more times a length of the non-translucent region in the first direction.

DETAILED DESCRIPTION

Figure 1:
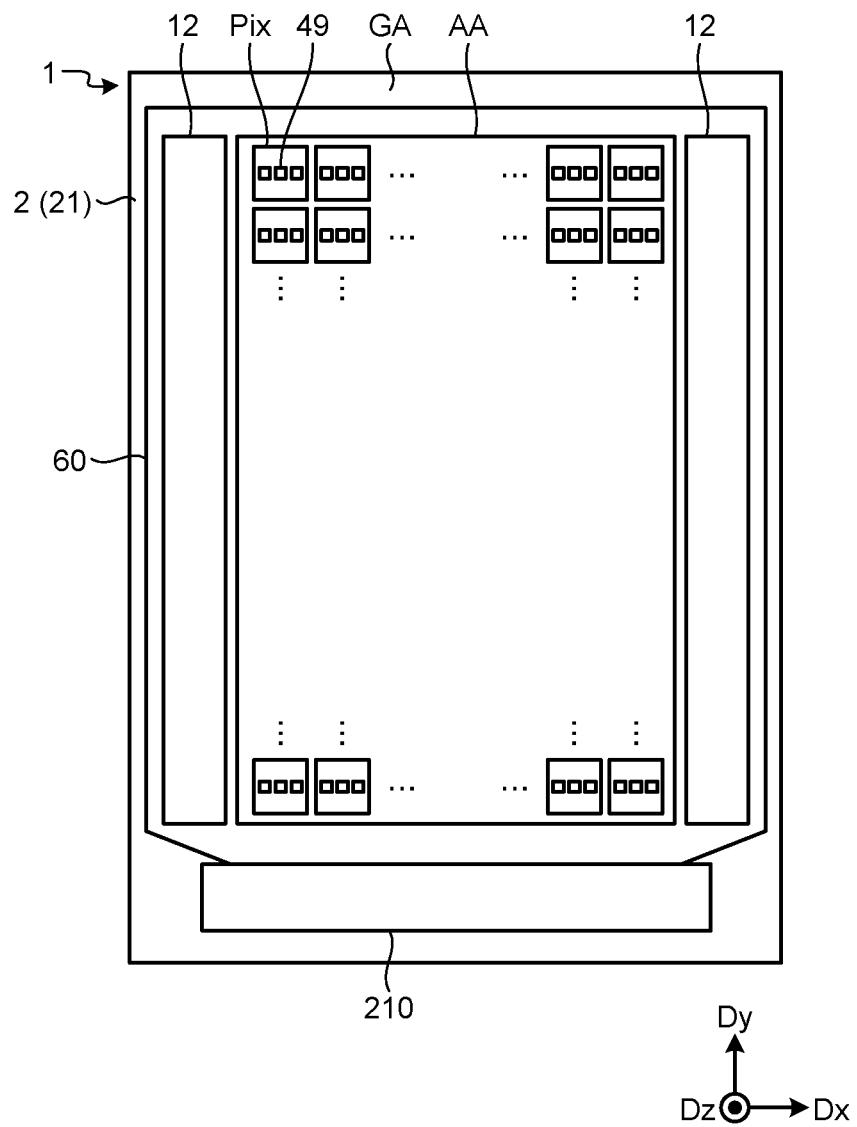
FIG. 1 is a plan view schematically illustrating a display device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To clarify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit substrate that drives the pixels Pix and is also called a backplane or an active matrix substrate. The array substrate 2 includes a substrate 21, a plurality of transistors, a plurality of capacitances, various kinds of wiring, and other components. Although not specifically illustrated, the array substrate 2 may be provided with a flexible printed circuit board (FPC) or the like that receives control signals and electric power to drive the drive circuits 12 and the drive IC 210.

As illustrated in FIG. 1, the display device 1 has a display region AA and a peripheral region GA. The display region AA is disposed overlapping the pixels Pix and displays an image. The peripheral region GA does not overlap the pixels Pix and is positioned outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation viewed from the third direction Dz.

The drive circuits 12 are circuits that drive a plurality of gate lines GL (refer to FIG. 3) based on various control signals received from the drive IC 210 or the outside. The drive circuits 12 sequentially or simultaneously select a plurality of gate lines GL and supply gate drive signals to the selected gate lines GL. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as chip on glass (COG). The mounting form of the drive IC 210 is not limited thereto, and the drive IC 210 may be mounted on a flexible printed circuit board or a rigid circuit board coupled to the peripheral region GA of the substrate 21.

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light-emitting elements 3 are electrically coupled to the common cathode wiring 60 and are supplied with a reference potential (e.g., a ground potential). More specifically, a cathode terminal 32 (refer to FIG. 7) of the light-emitting element 3 is coupled to the cathode wiring 60 via a cathode electrode 22 and a cathode power supply line LVSS.

Figure 2:
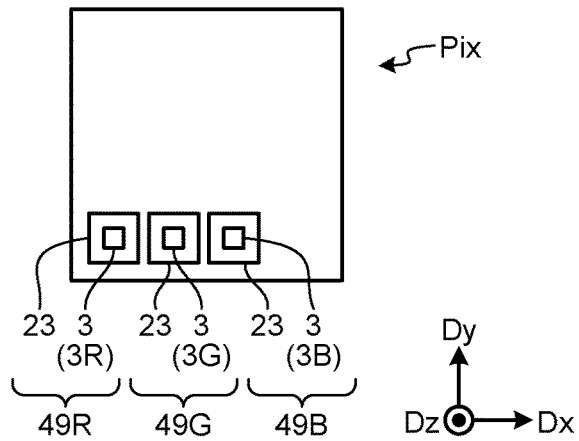
FIG. 2 is a plan view of one pixel Pix.

FIG. 2 is a plan view of one pixel Pix. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays the primary color of red as the first color. The second sub-pixel 49G displays the primary color of green as the second color. The third sub-pixel 49B displays the primary color of blue as the third color. As illustrated in FIG. 2, the first sub-pixel 49R, the second sub-pixel 49G, and the third sub-pixel 49B are adjacently disposed in the first direction Dx in one pixel Pix. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The first sub-pixel 49R, the second sub-pixel 49G, and the third sub-pixel 49B include a first light-emitting element 3R, a second light-emitting element 3G, and a third light-emitting element 3B, respectively, and each further include an anode electrode 23. The display device 1 displays an image by outputting different colors of light from the first light-emitting element 3R, the second light-emitting element 3G, and the third light-emitting element 3B in the first sub-pixel 49R, the second sub-pixel 49G, and the third sub-pixel 49B, respectively. The first light-emitting element 3R outputs red light. The second light-emitting element 3G outputs green light. The third light-emitting element 3B outputs blue light. In the following explanation, the first light-emitting element 3R, the second light-emitting element 3G, and the third light-emitting element 3B are simply referred to as light-emitting elements 3 when they need not be distinguished from one another.

The light-emitting elements 3 are provided to the respective sub-pixels 49. The light-emitting element 3 is a light-emitting diode (LED) chip having a size of approximately 3 μm to 300 μm in planar view. Although not strictly defined, LEDs having a chip size smaller than 100 μm are called micro LEDs. The display device 1 including micro LEDs in respective pixels is also called a micro LED display device. The term "micro" of the micro LED is not intended to limit the size of the light-emitting element 3.

The light-emitting elements 3 may output different colors of light in four or more colors. The arrangement of the sub-pixels 49 is not limited to the configuration illustrated in FIG. 2. The first sub-pixel 49R, for example, may be disposed adjacently to the second sub-pixel 49G in the second direction Dy. The first sub-pixel 49R, the second sub-pixel 49G, and the third sub-pixel 49B may be disposed in a triangular grid. The arrangement order of the first sub-pixel 49R, the second sub-pixel 49G, and the third sub-pixel 49B in the first direction Dx may be different.

Figure 3:
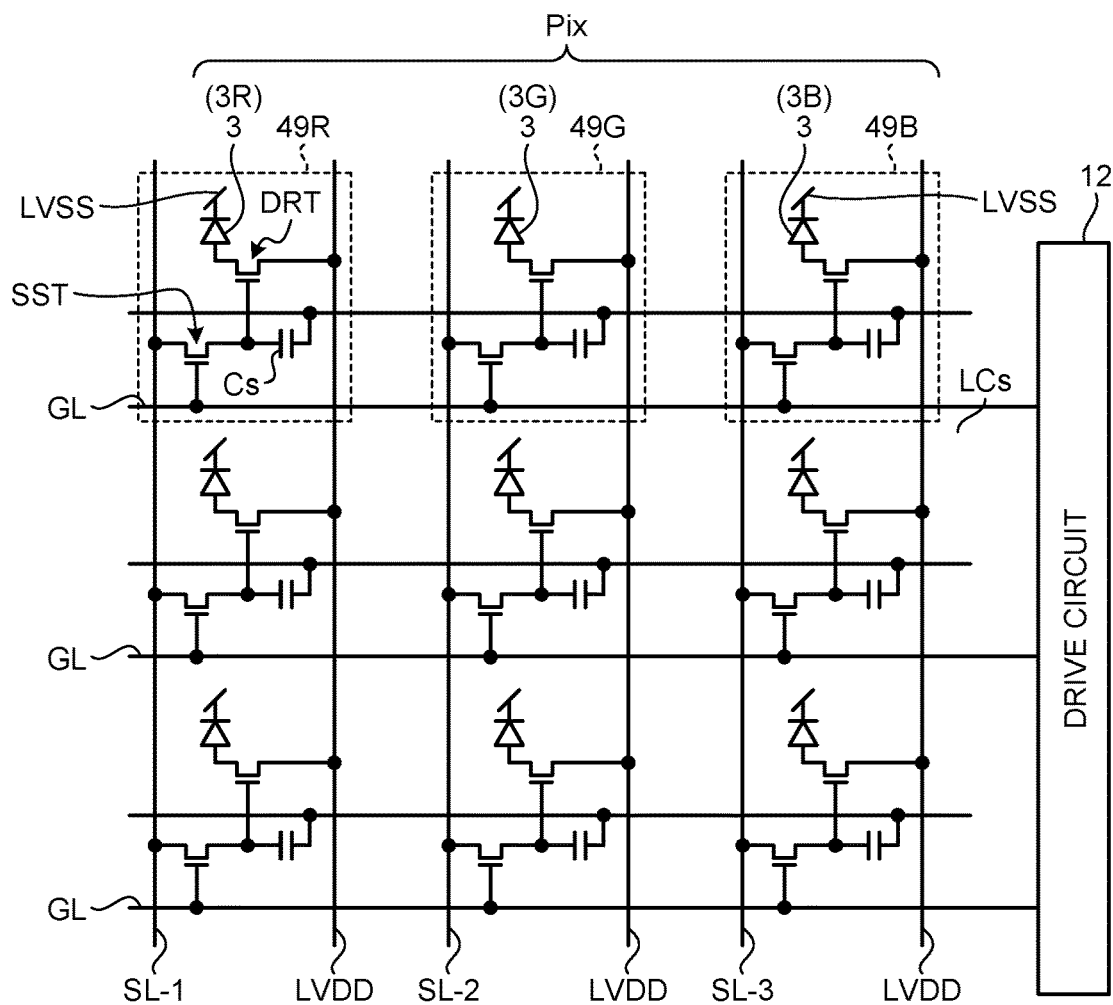
FIG. 3 is a circuit diagram of pixel circuits.

FIG. 3 is a circuit diagram of pixel circuits. The pixel circuits illustrated in FIG. 3 are circuits provided to the substrate 21 to supply drive signals (electric current) to the respective light-emitting elements 3. As illustrated in FIG. 3, the gate lines GL extend in the first direction Dx and are each coupled to the first sub-pixel 49R, the second sub-pixel 49G, and the third sub-pixel 49B. A first signal line SL-1, a second signal line SL-2, and a third signal line SL-3 extend in the second direction Dy. The first signal line SL-1 is coupled to the first sub-pixels 49R arrayed in the second direction Dy.

The second signal line SL-2 is coupled to the second sub-pixels 49G arrayed in the second direction Dy. The third signal line SL-3 is coupled to the third sub-pixels 49B arrayed in the second direction Dy. In the following explanation, the first signal line SL-1, the second signal line SL-2, and the third signal line SL-3 are simply referred to as signal lines SL when they need not be distinguished from one another.

As illustrated in FIG. 3, each sub-pixel 49 includes two transistors and one capacitance. Specifically, each sub-pixel 49 includes a drive transistor DRT, a writing transistor SST, and capacitance Cs.

The transistors included in the sub-pixel 49 are composed of n-type thin-film transistors (TFTs). The present embodiment is not limited thereto, and the transistors may be composed of p-type TFTs.

The gate of the drive transistor DRT is coupled to the drain of the writing transistor SST. The source of the drive transistor DRT is coupled to an anode power supply line LVDD. The drain of the drive transistor DRT is coupled to the anode of the light-emitting element 3. The cathode of the light-emitting element 3 is coupled to the cathode power supply line LVSS and is supplied with the reference potential.

The gate of the writing transistor SST is coupled to the gate line GL. The source of the writing transistor SST is coupled to the signal line SL. The drain of the writing transistor SST is coupled to the gate of the drive transistor DRT.

The capacitance Cs is coupled to the gate of the drive transistor DRT and the drain of the writing transistor SST at one end and to common wiring LCs at the other end. The common wiring LCs is electrically coupled to the cathode power supply line LVSS and is supplied with the reference potential. The capacitance Cs is added to the pixel circuit to suppress fluctuations in gate voltage due to parasitic capacitance and leakage current in the drive transistor DRT.

The writing transistor SST functions as a switching element that selects electrical continuity and discontinuity between two nodes. The drive transistor DRT functions as a current control element that controls an electric current flowing through the light-emitting element 3 based on the voltage between the gate and the drain.

Specifically, the drive circuits 12 select a plurality of gate lines GL and supply gate drive signals to the selected gate lines GL. When the electric potential of the gate line GL is switched to an H (high) level by the gate drive signals, the writing transistor SST is turned on. As a result, an electric charge is accumulated in the capacitance Cs based on video signals supplied from the signal line SL. The voltage between the gate and the drain of the drive transistor DRT is determined based on the amount of electric charge in the capacitance Cs.

An electric current flows through the drive transistor DRT based on an anode power supply potential PVDD supplied from the anode power supply line LVDD. The drive transistor DRT supplies an electric current corresponding to the voltage between the gate and the drain to the light-emitting element 3. The light-emitting element 3 emits light with the luminance corresponding to the electric current. After the writing transistor SST is turned off, an electric current is supplied to the light-emitting element 3 from the anode power supply line LVDD via the drive transistor DRT.

Figure 4:
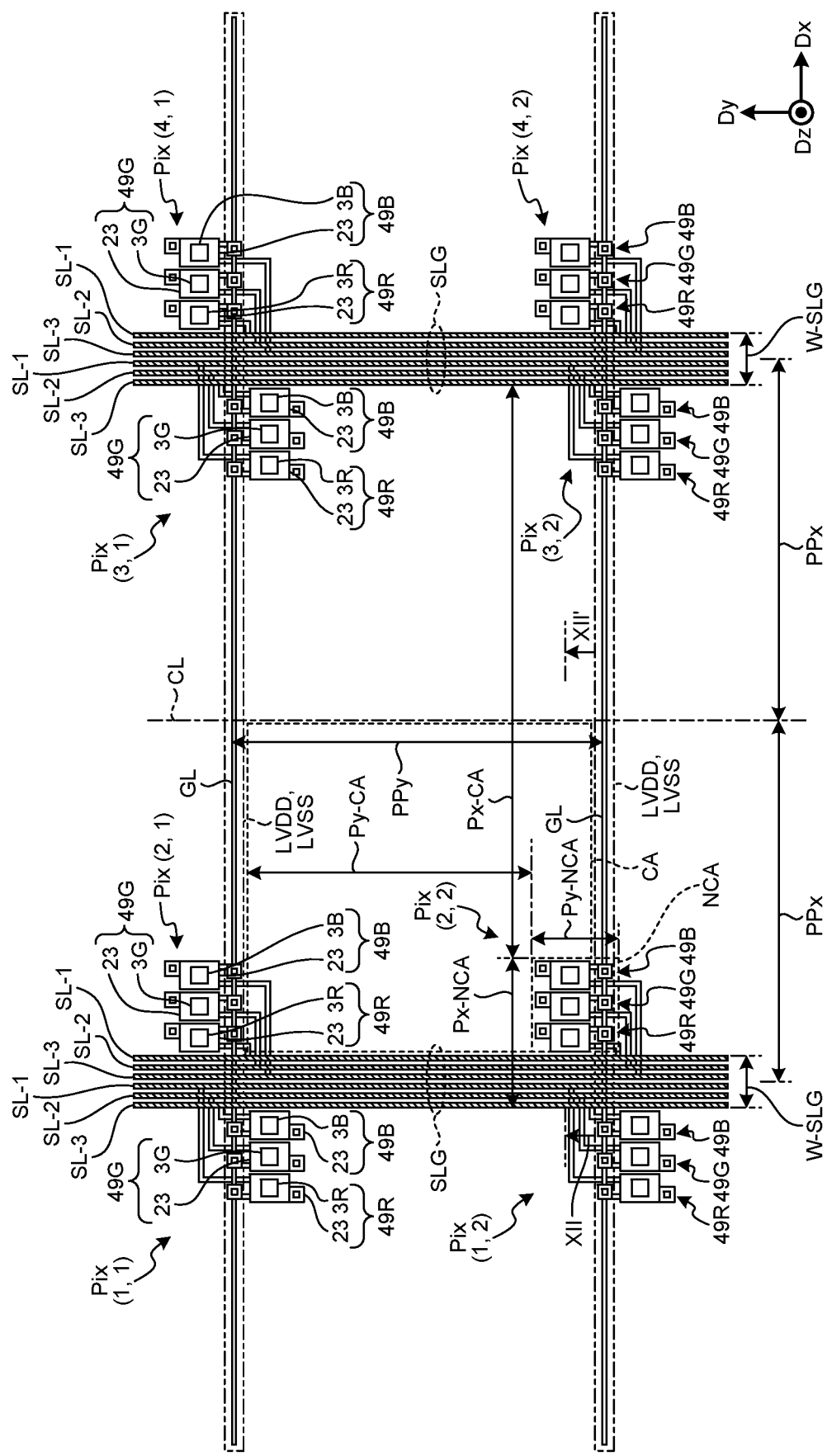
FIG. 4 is a plan view schematically illustrating a plurality of pixels.

The following describes a specific example of the configuration of the pixel Pix in planar view. FIG. 4 is a plan view schematically illustrating a plurality of pixels. FIG. 4 illustrates eight pixels Pix in two rows and four columns in an enlarged manner out of the pixels Pix arrayed in the display region AA. Specifically, as illustrated in FIG. 4, the pixels Pix (1,1), Pix (2,1), Pix (3,1), and Pix (4,1) are arrayed in the first direction Dx. The pixels Pix (1,1) and Pix (1,2) are arrayed in the second direction Dy. The pixels Pix (2,1) and Pix (2,2) are arrayed in the second direction Dy. The pixels Pix (3,1) and Pix (3,2) are arrayed in the second direction Dy. The pixels Pix (4,1) and Pix (4,2) are arrayed in the second direction Dy. The pixels Pix (1,1), Pix (2,1), Pix (3,1), Pix (4,1), Pix (1,2), Pix (2,2), Pix (3,2), and Pix (4,2) are simply referred to as the pixels Pix when they need not be distinguished from one another.

The pixels Pix each include the first light-emitting element 3R (first sub-pixel 49R), the second light-emitting element 3G (second sub-pixel 49G), the third light-emitting element 3B (third sub-pixel 49B), the first signal line SL-1, the second signal line SL-2, the third signal line SL-3, and the gate line GL. The first light-emitting element 3R is electrically coupled to the first signal line SL-1. The second light-emitting element 3G is electrically coupled to the second signal line SL-2. The third light-emitting element 3B is electrically coupled to the third signal line SL-3.

According to the present embodiment, in two pixels Pix adjacently disposed in the first direction Dx according to the present embodiment, a plurality of light-emitting elements 3 and a plurality of signal lines SL (signal line group SLG) are collectively and closely disposed. One pixel Pix and the other pixel Pix adjacent to each other are disposed in such a positional relation that they are inverted with respect to a virtual line serving as the axis of symmetry parallel to the second direction Dy.

Two pixels Pix (e.g., the pixels Pix (2,2) and Pix (3,2)) adjacently disposed in the first direction Dx corresponds to a region surrounded by two signal line groups SLG adjacently disposed in the first direction Dx and two gate lines GL adjacently disposed in the second direction Dy. An arrangement pitch PPx of the pixels Pix in the first direction Dx is represented by the distance between the midpoint of a width W-SLG of the signal line group SLG in the first direction Dx and a virtual line CL. The virtual line CL is a virtual line that passes through the midpoint between the signal line groups SLG adjacently disposed in the first direction Dx and extends in a direction parallel to the signal lines SL. In other words, the arrangement pitch PPx is one half of the arrangement pitch of the signal line groups SLG adjacently disposed in the first direction Dx.

An arrangement pitch PPy of the pixels Pix in the second direction Dy is equal to the arrangement pitch of the gate lines GL adjacently disposed in the second direction Dy. In other words, the arrangement pitch PPy is represented by the distance between the ends in the second direction Dy (+Dy direction) of the gate lines GL adjacently disposed in the second direction Dy.

The pixels Pix each have a translucent region CA and a non-translucent region NCA. The translucent region CA is a region with an aperture ratio of 80% or higher in a predetermined region, that is, a region where the ratio of the area not overlapping various kinds of wiring, such as the signal lines SL and the gate lines GL, the anode electrodes 23 coupled to the light-emitting elements 3, or other components to the area of the predetermined region is 80% or higher. The non-translucent region NCA is a region with an aperture ratio of lower than 80% in the predetermined region, that is, a region where the ratio of the area not overlapping various kinds of wiring, such as the signal lines SL and the gate lines GL, the anode electrodes 23 coupled to the light-emitting elements 3, or other components to the area of the predetermined region is lower than 80%.

In the display device 1, the area of the translucent region CA is larger than that of the non-translucent region NCA. Therefore, the background on a second main surface 21B side of the substrate 21 (refer to FIG. 7) is visually recognized from a first main surface 21A side (cover glass 101 side) of the substrate 21 through the translucent region CA in the pixels Pix where the light-emitting elements 3 do not emit light. The background on the first main surface 21A side (cover glass 101 side) is also visually recognized from the second main surface 21B side of the substrate 21. When receiving video signals from the drive IC 210, the display device 1 according to the present embodiment causes the light-emitting elements 3 of the pixels Pix to emit light based on the video signals. The image displayed by the pixels Pix is visually recognized with the background. In other words, the display device 1 is what is called a transparent display through which the other side of the display region AA can be seen.

Figure 5:
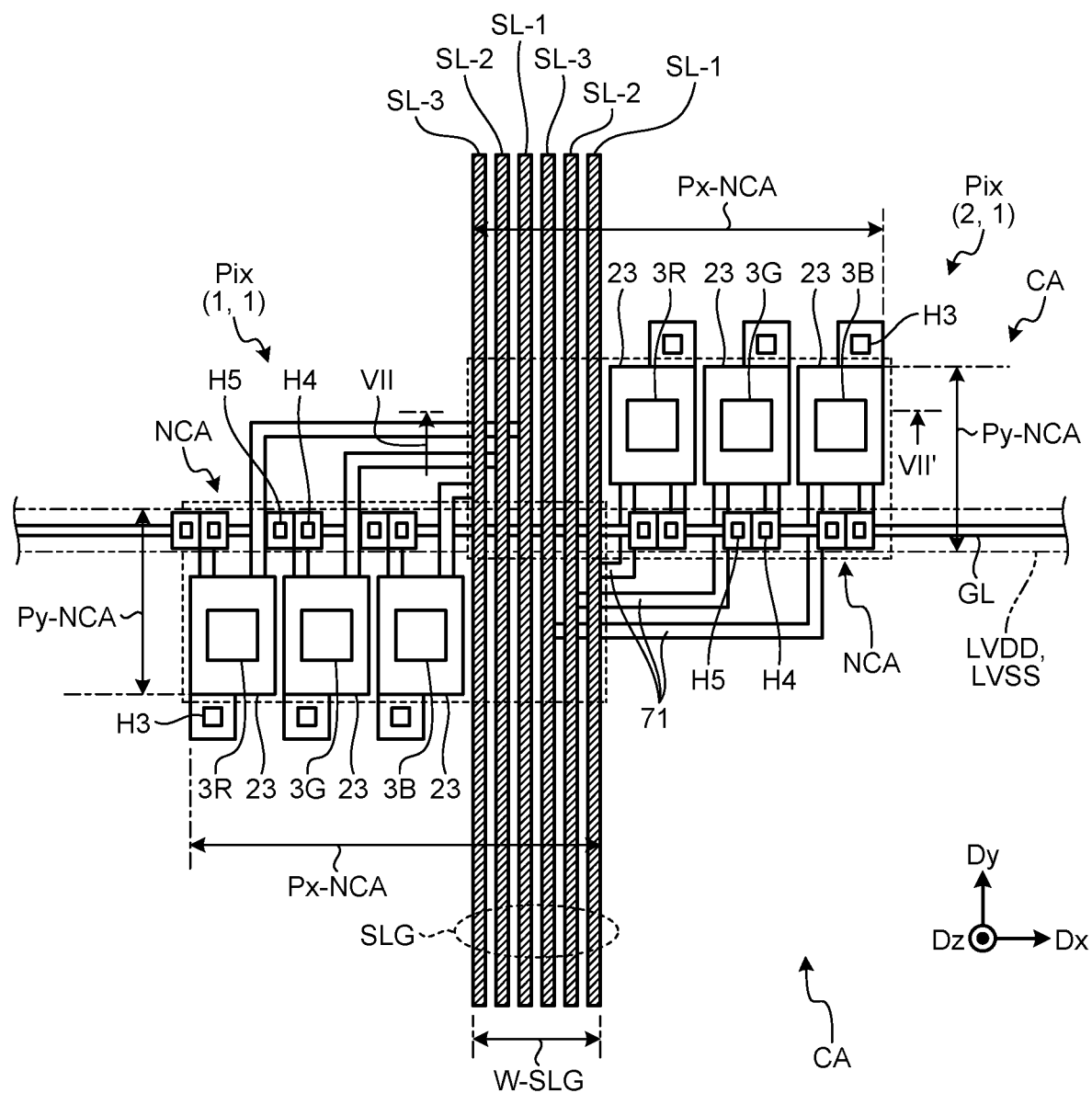
FIG. 5 is an enlarged plan view of two adjacent pixels illustrated in FIG. 4.

The following describes a specific example of the configuration of the pixels Pix, focusing on the pixels Pix (1,1) and Pix (2,1) adjacently disposed in the first direction Dx. FIG. 5 is an enlarged plan view of two adjacent pixels illustrated in FIG. 4. In the following description, one side (direction toward the right side in FIG. 5) of the first direction Dx may be referred to as +Dx direction, and the other side (direction toward the left side in FIG. 5) of the first direction Dx may be referred to as −Dx direction. Similarly, one side (direction toward the upper side in FIG. 5) of the second direction Dy may be referred to as +Dy direction, and the other side (direction toward the lower side in FIG. 5) of the second direction Dy may be referred to as −Dy direction.

The signal line group SLG includes a plurality of signal lines SL adjacently disposed in the first direction Dx. Specifically, three signal lines SL coupled to the pixel Pix (1,1) (first pixel) on the left side in FIG. 5 and three signal lines SL coupled to the pixel Pix (2,1) (second pixel) on the right side in FIG. 5 are adjacently disposed in the first direction Dx to form a single signal line group SLG. In other words, the signal line group SLG includes a pair of first signal lines SL-1, a pair of second signal lines SL-2, and a pair of third signal lines SL-3. In the signal line group SLG, the third signal line SL-3, the second signal line SL-2, the first signal line SL-1, the third signal line SL-3, the second signal line SL-2, and the first signal line SL-1 are disposed in this order in the first direction Dx. The three signal lines SL coupled to the pixel Pix (1,1) on the left side and the three signal lines SL coupled to the pixel Pix (2,1) on the right side are arrayed in the same arrangement relation in the first direction Dx. The present embodiment is not limited thereto, and the arrangement of the signal line group SLG may be appropriately changed.

In one signal line group SLG, the signal lines SL are arrayed apart from each other with a space formed therebetween in the first direction Dx. The width W-SLG of the signal line group SLG includes the widths of the signal lines SL and the spaces between the signal lines SL. In the signal line group SLG, the line width of the signal line SL and the space between the signal lines SL are set such that the aperture ratio is lower than 80%. Thus, the region overlapping the signal line group SLG is the non-translucent region NCA.

In each of the pixels Pix, the first light-emitting element 3R, the second light-emitting element 3G, and the third light-emitting element 3B are adjacently disposed in the first direction Dx and are provided near the intersection of the signal line group SLG and the gate line GL. Specifically, the signal line group SLG is provided between the light-emitting elements 3 constituting the pixel Pix (1,1) and the light-emitting elements 3 constituting the pixel Pix (2,1) in the first direction Dx. The gate line GL intersecting the signal line group SLG is provided between the light-emitting elements 3 constituting the pixel Pix (1,1) and the light-emitting elements 3 constituting the pixel Pix (2,1) in the second direction Dy.

The first light-emitting element 3R, the second light-emitting element 3G, and the third light-emitting element 3B constituting the pixel Pix (1,1) are arrayed in this order in the first direction Dx. The first light-emitting element 3R, the second light-emitting element 3G, and the third light-emitting element 3B are disposed adjacently to the signal line group SLG in the first direction Dx (−Dx direction). The first light-emitting element 3R, the second light-emitting element 3G, and the third light-emitting element 3B constituting the pixel Pix (1,1) are disposed adjacently to the gate line GL intersecting the signal line group SLG in the −Dy direction.

The first light-emitting element 3R, the second light-emitting element 3G, and the third light-emitting element 3B constituting the pixel Pix (2,1) are arrayed in this order in the first direction Dx and are disposed adjacently to the signal line group SLG in the first direction Dx (+Dx direction). The first light-emitting element 3R, the second light-emitting element 3G, and the third light-emitting element 3B constituting the pixel Pix (2,1) are disposed adjacently to the gate line GL in the +Dy direction. The light-emitting elements 3 of the pixel Pix (1,1) and the light-emitting elements 3 of the pixel Pix (2,1) are arrayed in the same arrangement relation in the first direction Dx. The order of arrangement of the light-emitting elements 3 may be different depending on the pixel Pix.

Each light-emitting element 3 is coupled to the signal line SL via a semiconductor layer 71 of the writing transistor SST. The light-emitting element 3 is electrically coupled to the anode power supply line LVDD through a contact hole H4. The anode power supply line LVDD and the cathode power supply line LVSS are provided overlapping the gate line GL and extend in the first direction Dx. In FIGS. 4 and 5, the anode power supply line LVDD and the cathode power supply line LVSS are represented by the alternate long and two short dashes lines to make the drawings easy to see.

The non-translucent region NCA of each pixel Pix includes a region overlapping the first light-emitting element 3R, the second light-emitting element 3G, and the third light-emitting element 3B adjacently disposed in the first direction Dx, the anode electrodes 23 coupled to the respective light-emitting elements 3, and the signal line group SLG. The non-translucent region NCA is a region also including the spaces between the signal lines SL, the spaces between the anode electrodes 23, and the space between the anode electrodes 23 and the gate line GL, for example. In other words, the signal line group SGL and the light-emitting elements 3 are adjacently disposed in the first direction Dx to form the non-translucent region NCA continuously extending in the first direction Dx.

In the pixel Pix (1,1), a length Px-NCA of the non-translucent region NCA in the first direction Dx is the length from the end of the anode electrode 23 coupled to the first light-emitting element 3R in the first direction Dx (−Dx direction) to the end of the signal line group SLG in the first direction Dx (+Dx direction). A length Py-NCA of the non-translucent region NCA in the second direction Dy is the length from the end of the anode electrodes 23 coupled to the respective light-emitting elements 3 in the second direction Dy (−Dy direction) to the end of the anode power supply line LVDD or the cathode power supply line LVSS in the second direction Dy (+Dy direction).

In the pixel Pix (2,1), the length Px-NCA of the non-translucent region NCA in the first direction Dx is the length from the end of the anode electrode 23 coupled to the third light-emitting element 3B in the first direction Dx (+Dx direction) to the end of the third signal line SL-3 coupled to the adjacent pixel Pix (1,1) in the first direction Dx (−Dx direction). The length Py-NCA of the non-translucent region NCA in the second direction Dy is the length from the end of the anode electrodes 23 coupled to the respective light-emitting elements in the second direction Dy (+Dy direction) to the end of the anode power supply line LVDD or the cathode power supply line LVSS in the second direction Dy (−Dy direction).

Referring back to FIG. 4, the configurations of the pixels Pix (3,1) and Pix (4,1) are the same as those of the pixels Pix (1,1) and (2,1), respectively. In other words, a plurality of signal lines SL are bundled and disposed to form the signal line group SLG for each two pixels Pix adjacently disposed in the first direction Dx. The light-emitting elements 3 constituting each of the two pixels Pix adjacently disposed in the first direction Dx are disposed closely to the signal line group SLG. The light-emitting elements 3 of the pixel Pix (2,1) and the light-emitting elements 3 of the pixel Pix (3,1) are disposed between the signal line groups SLG adjacently disposed in the first direction Dx. In other words, no signal line SL is provided between the light-emitting elements 3 of the pixel Pix (2,1) and the light-emitting elements 3 of the pixel Pix (3,1), and the translucent region CA is continuously formed in the first direction Dx with a length of approximately the arrangement pitches PPx of two pixels Pix.

The arrangement pitches PPx and PPy of the pixels Pix are sufficiently long compared with the lengths Px-NCA and Py-NCA of the non-translucent region NCA. In other words, the translucent region CA and the non-translucent region NCA are adjacently formed in the first direction Dx. The following specifically describes the relation between the translucent region CA and the non-translucent region NCA using the pixels Pix (2,1), Pix (2,2), and Pix (3,2) illustrated in FIG. 4 as an example. A length Px-CA of the translucent region CA in the first direction Dx is equal to the distance between the end of the anode electrode 23 of the pixel Pix (e.g., the pixel Pix (2,2)) in the +Dx direction and the signal line group SLG of the pixel Pix (e.g., the pixel Pix (3,2)) adjacent thereto in the first direction Dx. A length Py-CA of the translucent region CA in the second direction Dy is equal to the distance between the end of the anode electrode 23 of the pixel Pix (e.g., the pixel Pix (2,2)) in the +Dy direction and the power supply line (the anode power supply line LVDD or the cathode power supply line LVSS) of the pixel Pix (e.g., the pixel Pix (2,1)) adjacent thereto in the second direction Dy.

The length Px-CA of the translucent region CA in the first direction Dx is five or more times the length Px-NCA of the non-translucent region NCA in the first direction Dx. Similarly, the length Py-CA of the translucent region CA in the second direction Dy is five or more times the length Py-NCA of the non-translucent region NCA in the second direction Dy. With this configuration, the display device 1 enables the background to be visually recognized and can suppress reduction in transmittance.

The pixels Pix (e.g., the pixels Pix (1,2) and (2,2)) adjacently disposed in the first direction Dx are different in the positions of the light-emitting elements 3 in the second direction Dy. The light-emitting elements 3 of the pixel Pix (1,2) are disposed adjacently to the gate line GL in the −Dy direction. The light-emitting elements 3 of the pixel Pix (2,2) are disposed adjacently to the gate line GL in the +Dy direction. This configuration can decrease the length Px-NCA of the non-translucent region NCA in the first direction Dx and increase the length Px-CA of the translucent region CA in the first direction Dx compared with a case where six light-emitting elements 3 are adjacently disposed in the first direction Dx in the pixels Pix adjacent in the first direction Dx.

Figure 6:
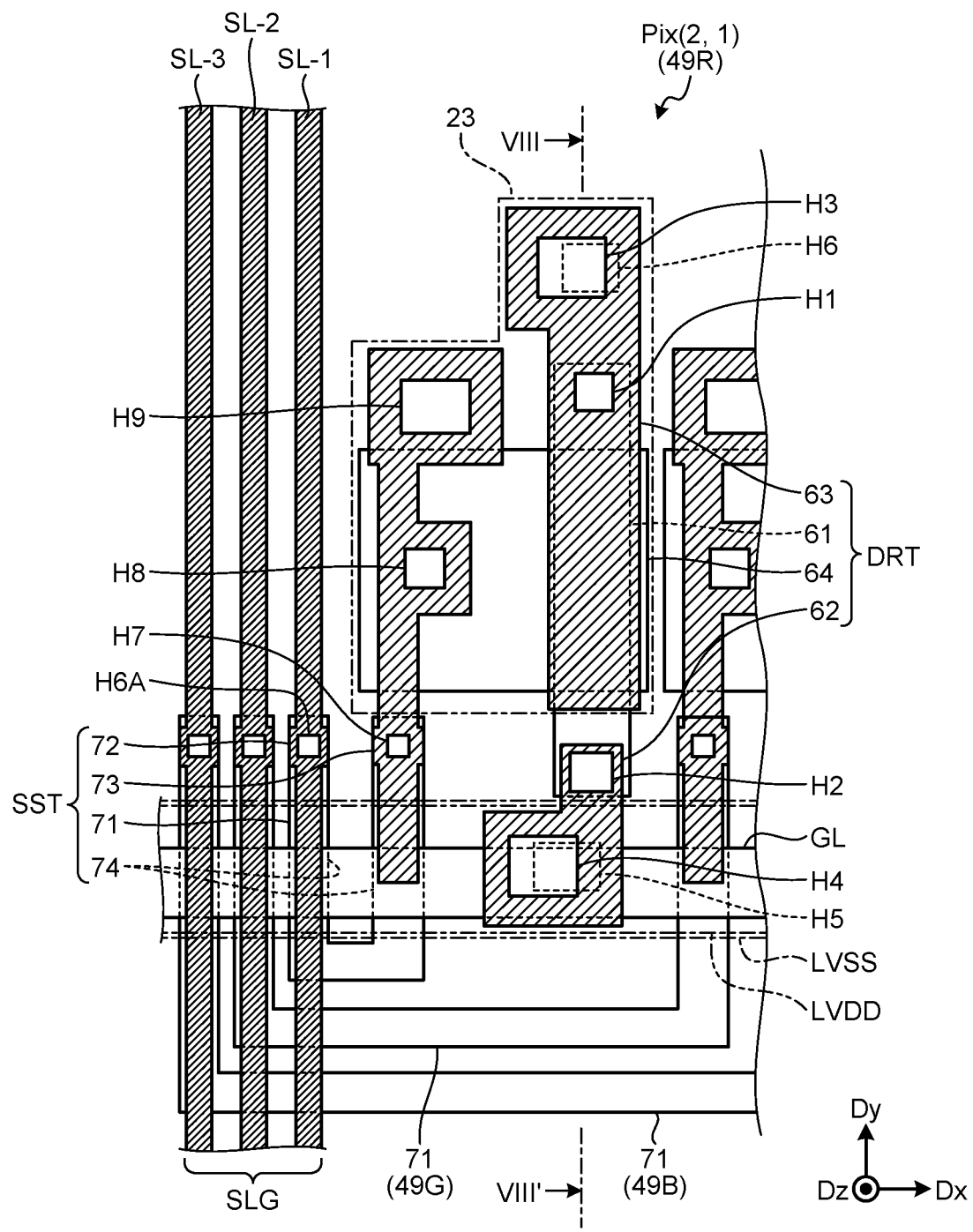
FIG. 6 is a plan view of an example of the configuration of transistors provided corresponding to one light-emitting element.

The following describes planar and sectional structures of the pixel Pix in detail. FIG. 6 is a plan view of an example of the configuration of the transistors provided corresponding to one light-emitting element. While FIG. 6 illustrates the configuration of the drive circuit of the first sub-pixel 49R in an enlarged manner, the description of the first sub-pixel 49R is also applicable to the second sub-pixel 49G and the third sub-pixel 49B. In FIG. 6, the light-emitting element 3, a mounting electrode 24 (refer to FIG. 7), and other components provided on the upper side of the anode electrode 23 are not illustrated.

As illustrated in FIG. 6, the drive transistor DRT includes a semiconductor layer 61, a source electrode 62, a drain electrode 63, and a gate electrode 64. The semiconductor layer 61 extends in the second direction Dy and intersects the gate electrode 64 in planar view. A channel region is formed in a region overlapping the gate electrode 64 in the semiconductor layer 61. One end of the semiconductor layer 61 is coupled to the drain electrode 63 through a contact hole H1. The drain electrode 63 is coupled to the anode electrode 23 through a contact hole H3. The anode electrode 23 is electrically coupled to the mounting electrode 24 and the light-emitting element 3 through a contact hole H6.

Figure 8:
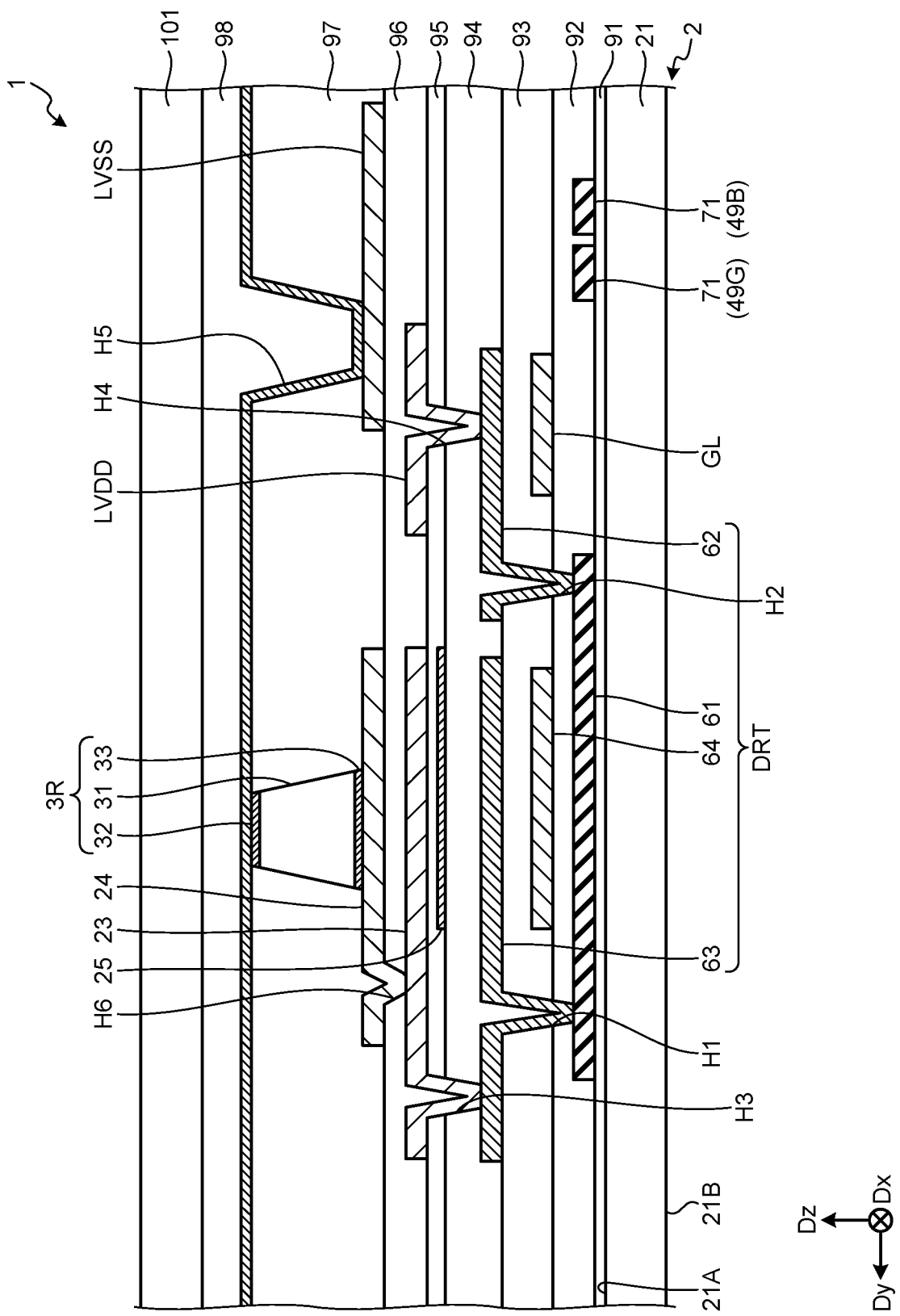
FIG. 8 is a sectional view along line VIII-VIII' of FIG. 6.

The other end of the semiconductor layer 61 is coupled to the source electrode 62 through a contact hole H2. The source electrode 62 extends to a region overlapping the anode power supply line LVDD and is coupled to the anode power supply line LVDD through a contact hole H4. As illustrated in FIG. 8, which will be described later, a contact hole H5 electrically couples the cathode power supply line LVSS and the cathode electrode 22. As illustrated in FIG. 5, the contact holes H5 are formed for the respective sub-pixels 49 and are linearly formed along the gate line GL so as to overlap the gate line GL, the anode power supply line LVDD, and the cathode power supply line LVSS. The embodiment does not necessarily have the contact holes H5 for the respective sub-pixels 49. Alternatively, one contact hole H5 may be formed for each of the pixels Pix, and the cathode electrode 22 extending over the three sub-pixels 49 may be coupled to the cathode power supply line LVSS through the contact hole H5. As described above, the drive transistor DRT can supply the light-emitting element 3 with voltage signals based on the anode power supply potential PVDD from the anode power supply line LVDD.

As illustrated in FIG. 6, the writing transistor SST includes a semiconductor layer 71, a source electrode 72, a drain electrode 73, and a gate electrode 74. The semiconductor layer 71 has two parts extending in the second direction Dy and a coupling part coupling these two parts. The two parts of the semiconductor layer 71 extending in the second direction Dy each intersect the gate line GL in planar view. The parts of the gate line GL overlapping the semiconductor layer 71 each function as the gate electrode 74.

One end of the semiconductor layer 71 is provided overlapping the source electrode 72 and is coupled to the source electrode 72 through a contact hole H6A. In other words, the part of the signal line SL (first signal line SL-1) coupled to the semiconductor layer 71 functions as the source electrode 72. The other end of the semiconductor layer 71 is coupled to the drain electrode 73 through a contact hole H7.

The drain electrode 73 extends in the second direction Dy and is coupled to the gate electrode 64 through a contact hole H8. The drain electrode 73 is also coupled to a counter electrode 25 through a contact hole H9. As described above, the writing transistor SST is coupled to the gate of the drive transistor DRT.

The arrangement or the like of the drive circuit of the sub-pixel 49 illustrated in FIG. 6 is given by way of example only and may be changed. The semiconductor layer 71 of the second sub-pixel 49G, for example, intersects the first signal line SL-1 in planar view. The semiconductor layer 71 of the second sub-pixel 49G intersects the first signal line SL-1 and the second signal line SL-2 in planar view. The present embodiment is not limited thereto, and the semiconductor layer 71 may be coupled to the source electrode 72 via bridge wiring provided in a layer different from that of the semiconductor layer 71 at the intersection with the signal lines SL coupled to the other sub-pixels 49.

Figure 7:
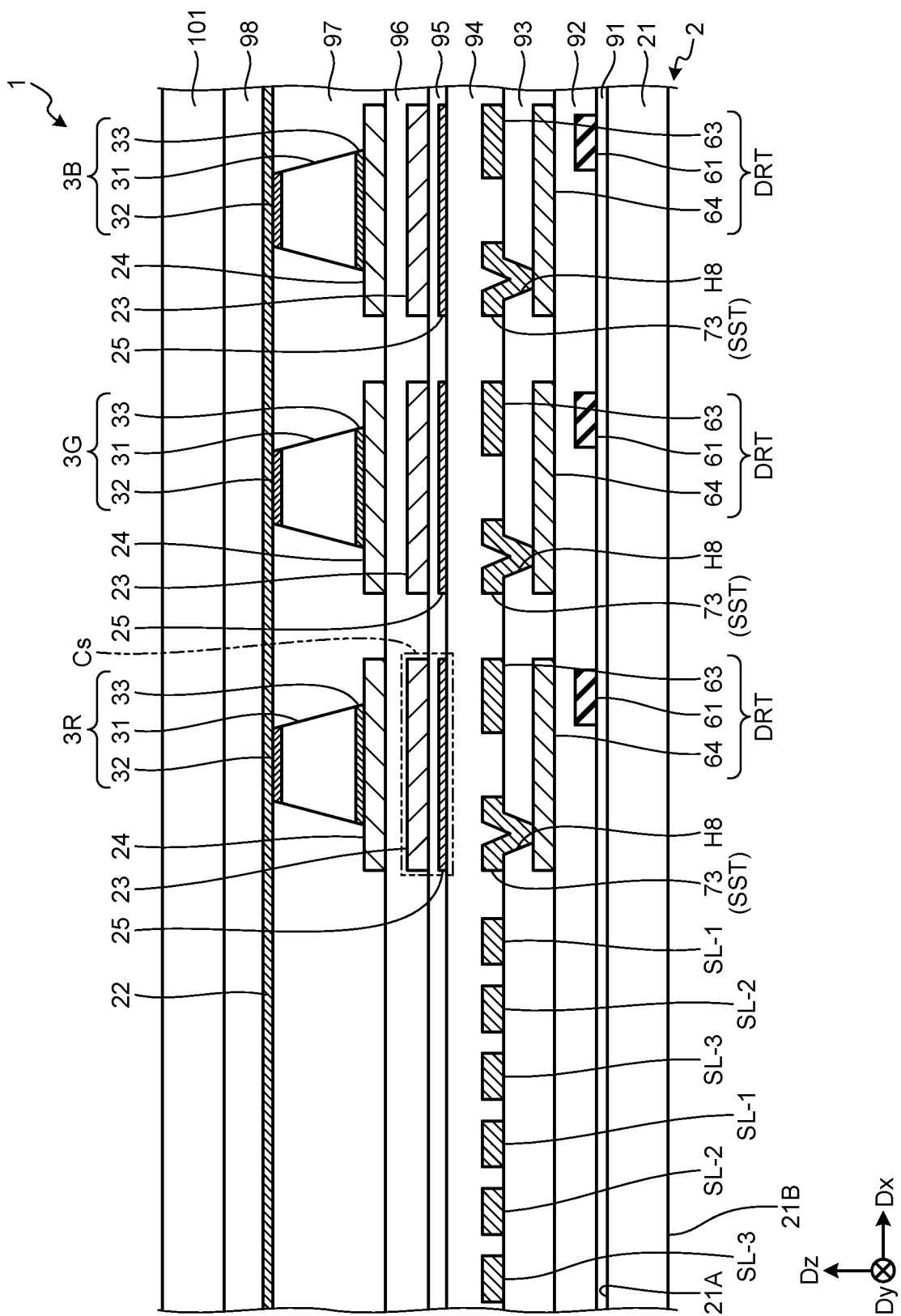
FIG. 7 is a sectional view along line VII-VII' of FIG. 5.

The following describes a sectional structure of the display device 1. FIG. 7 is a sectional view along line VII-VII' of FIG. 5. FIG. 8 is a sectional view along line VIII-VIII' of FIG. 6. As illustrated in FIGS. 7 and 8, the light-emitting elements 3 are provided on the array substrate 2. The array substrate 2 includes the substrate 21, the anode electrodes 23, the mounting electrodes 24, the counter electrodes 25, various transistors, various kinds of wiring, and various insulating films.

The substrate 21 is an insulating substrate and is, for example, a glass substrate made of quartz or alkali-free glass or a resin substrate made of polyimide. If the substrate 21 is a flexible resin substrate, the display device 1 may be provided as a sheet display. The substrate 21 is not necessarily made of polyimide and may be made of other resin materials.

In the present specification, a direction from the substrate 21 toward the light-emitting element 3 in a direction perpendicular to the surface of the substrate 21 is referred to as an "upper side" or simply as "top". A direction from the light-emitting element 3 toward the substrate 21 is referred to as a "lower side" or simply as "bottom".

An undercoat film 91 is provided on the substrate 21. The undercoat film 91 is formed by stacking a plurality of inorganic insulating films, such as a silicon nitride film and a silicon oxide film. The undercoat film 91 may be a single layer film or is not necessarily provided.

The drive transistors DRT and the writing transistors SST are provided on the undercoat film 91. The semiconductor layers 61 and the semiconductor layers 71 (refer to FIG. 8) are provided on the undercoat film 91. The semiconductor layers 61 and 71 are made of polycrystalline silicon, for example. The material of the semiconductor layers 61 and 71 is not limited thereto and may be microcrystalline oxide semiconductor, amorphous oxide semiconductor, or low-temperature polycrystalline silicon, for example.

A gate insulating film 92 is provided on the undercoat film 91 to cover the semiconductor layers 61 and 71. The gate insulating film 92 is a silicon oxide film, for example. The gate electrodes 64 and the gate lines GL (refer to FIG. 8) are provided on the gate insulating film 92. The gate electrode 64 and the gate line GL are made of molybdenum (Mo), for example. Alternatively, the gate electrode 64 and the gate line GL may be a multilayered film of molybdenum and aluminum (Mo/Al/Mo) or a multilayered film of titanium and aluminum (Ti/Al/Ti). A black member is stacked on the surface of the metal film described above of the gate line GL. The black member will be described later.

In the example illustrated in FIGS. 7 and 8, the drive transistor DRT has a top-gate structure in which the gate electrode 64 is provided on the semiconductor layer 61. The present embodiment is not limited thereto, and the drive transistor DRT may have a bottom-gate structure in which the gate electrode 64 is provided under the semiconductor layer 61 or a dual-gate structure in which the gate electrodes 64 are provided both on and under the semiconductor layer 61. The writing transistor SST can employ the same structure as that of the drive transistor DRT.

An interlayer insulating film 93 is provided on the gate insulating film 92 to cover the gate electrodes 64 and the gate lines GL. The interlayer insulating film 93 has a multilayered structure composed of a silicon nitride film and a silicon oxide film, for example. The source electrodes 62 (refer to FIG. 8), the drain electrodes 63, the signal lines SL (source electrodes 72), and the drain electrodes 73 are provided on the interlayer insulating film 93.

As illustrated in FIG. 8, the drain electrode 63 is coupled to a drain region of the semiconductor layer 61 through the contact hole H1 passing through the gate insulating film 92 and the interlayer insulating film 93. The source electrode 62 is coupled to a source region of the semiconductor layer 61 through the contact hole H2 passing through the gate insulating film 92 and the interlayer insulating film 93. The signal lines SL, the source electrodes 62 and 72, and the drain electrodes 63 and 73 are multilayered films of titanium and aluminum (Ti/Al/Ti), for example. Alternatively, the signal lines SL, the source electrodes 62 and 72, and the drain electrodes 63 and 73 may be multilayered films of molybdenum and aluminum (Mo/Al/Mo). At least the signal lines SL out of the signal lines SL and various electrodes are stacked with a black member on the surface.

The drain electrode 63 extends to a region overlapping the gate electrode 64. Capacitance is formed by the drain electrode 63 and the gate electrode 64 facing each other with the interlayer insulating film 93 interposed therebetween.

As illustrated in FIGS. 7 and 8, a first organic insulating film 94 is provided on the interlayer insulating film 93 to cover the drive transistors DRT, the writing transistors SST, and the signal lines SL. The first organic insulating film 94 is made of an organic material, such as photosensitive acrylic. The organic material, such as photosensitive acrylic, is excellent in coverability for covering a difference in level of wiring and flatness on the surface compared with an inorganic insulating material formed by chemical vapor deposition (CVD), for example. The first organic insulating film 94 and a second organic insulating film 96 are flattening films that flatten the surface of the array substrate 2.

The counter electrodes 25, a capacitance insulating film 95, and the anode electrodes 23 are stacked in this order on the first organic insulating film 94. The counter electrode 25 is made of a translucent conductive material, such as indium tin oxide (ITO).

The capacitance insulating film 95 is provided to cover the counter electrodes 25 and has openings in the regions overlapping the contact holes H3 and H4 (refer to FIG. 8). The capacitance insulating film 95 is a silicon nitride film, for example. The anode electrode 23 faces the counter electrode 25 with the capacitance insulating film 95 interposed therebetween. The anode electrode 23 is electrically coupled to the drain electrode 63 through the contact hole H3. As a result, the anode electrode 23 is electrically coupled to the drive transistor DRT. The anode electrode 23 has a multilayered structure of titanium (Ti) and aluminum (Al) (e.g., Ti/Al/Ti). The structure is not limited thereto, and the anode electrode 23 may be a multilayered film of molybdenum and aluminum (Mo/Al/Mo) or may be made of alloy including at least one of molybdenum and titanium or of a translucent conductive material.

Capacitance Cs is formed between the anode electrode 23 and the counter electrode 25 facing each other with the capacitance insulating film 95 interposed therebetween. The counter electrode 25 made of ITO also functions as a barrier film to protect various kinds of wiring, such as the source electrode 62 and the drain electrode 63, in the process of forming the anode electrode 23.

The second organic insulating film 96 is provided on the anode electrodes 23. The second organic insulating film 96 has the contact hole H6 (refer to FIG. 8) that reaches the anode electrode 23. The second organic insulating film 96 is made of the same organic material as that of the first organic insulating film 94. The mounting electrode 24 js provided on the second organic insulating film 96 and is electrically coupled to the anode electrode 23 through the contact hole H6. The mounting electrode 24 has a multilayered structure of titanium and aluminum similarly to the anode electrode 23. Alternatively, the mounting electrode 24 may be made of a conductive material different from that of the anode electrode 23. The second organic insulating film 96 may be made of an organic material different from that of the first organic insulating film 94.

The light-emitting elements 3 (the first light-emitting element 3R, the second light-emitting element 3G, and the third light-emitting element 3B) are mounted on the respective mounting electrodes 24. Each light-emitting element 3 is mounted with its anode terminal 33 in contact with the mounting electrode 24. The method for bonding the anode terminal 33 of the light-emitting element 3 to the mounting electrode 24 may be any desired method as long as it can secure excellent continuity between them and does not damage the objects formed on the array substrate 2. Examples of the method for bonding the anode terminal 33 to the mounting electrode 24 include, but are not limited to, a method of ref lowing them using a low-temperature melting soldering material, a method of placing the light-emitting element 3 on the array substrate 2 with conductive paste interposed therebetween and sintering them, etc.

The light-emitting element 3 can be directly mounted on the anode electrode 23 without providing the second organic insulating film 96 or the mounting electrode 24 on the array substrate 2. Providing the second organic insulating film 96 and the mounting electrode 24, however, can prevent the capacitance insulating film 95 from being damaged by force applied when mounting the light-emitting element 3. In other words, this configuration can suppress dielectric breakdown between the anode electrode 23 and the counter electrode 25 that form the capacitance Cs.

The light-emitting element 3 includes a semiconductor layer 31, the cathode terminal 32, and the anode terminal 33. The semiconductor layer 31 can have a configuration in which an n-type cladding layer, an active layer, and a p-type cladding layer are stacked. The semiconductor layer 31 is made of a compound semiconductor, such as gallium nitride (GaN), aluminum indium phosphide (AlInP), and indium gallium nitride (InGaN). The semiconductor layer 31 may be made of different materials depending on the first light-emitting element 3R, the second light-emitting element 3G, and the third light-emitting element 3B. The active layer may have a multi-quantum well structure (MQW structure) in which well layers and barrier layers composed of several atomic layers are cyclically stacked for high efficiency. The light-emitting element 3 may have a configuration in which the semiconductor layer 31 is formed on a semiconductor substrate. The embodiment is not limited to the configuration in which the light-emitting element 3 alone is mounted on the array substrate 2. Alternatively, an LED chip including the light-emitting element 3 may be mounted on the array substrate 2.

An element insulating film 97 is provided between the light-emitting elements 3. The element insulating film 97 is made of a resin material. The element insulating film 97 covers at least the side surfaces of the light-emitting elements 3, and the cathode terminals 32 of the light-emitting elements 3 are exposed from the element insulating film 97. The element insulating film 97 is formed flat such that the upper surface of the element insulating film 97 and the upper surfaces of the cathode terminals 32 form the same plane. The position of the upper surface of the element insulating film 97 may be different from the position of the upper surfaces of the cathode terminals 32.

The cathode electrode 22 is provided covering the light-emitting elements 3 and the element insulating film 97 and is electrically coupled to the cathode terminals 32 of the light-emitting elements 3. The cathode electrode 22 is made of a translucent conductive material, such as ITO. This configuration can efficiently extract light output from the light-emitting elements 3 to the outside.

As illustrated in FIG. 8, the cathode electrode 22 extends to a region overlapping the gate line GL and is coupled to the cathode power supply line LVSS through the contact hole H5. The cathode power supply line LVSS is provided in the same layer as that of the mounting electrode 24, that is, on the second organic insulating film 96. The anode power supply line LVDD is provided in the same layer as that of the anode electrode 23, that is, on the capacitance insulating film 95 and is coupled to the source electrode 62 through the contact hole H4 formed at the position overlapping the gate line GL.

At least part of the anode power supply line LVDD and the cathode power supply line LVSS is provided overlapping the gate line GL. This configuration can make the area of the non-translucent region NCA (length Py-NCA in the second direction Dy) smaller than a case where the anode power supply line LVDD and the cathode power supply line LVSS are provided at positions not overlapping the gate line GL in planar view.

As illustrated in FIGS. 7 and 8, a cover glass 101 is provided on the cathode electrode 22 with an overcoat layer 98 interposed therebetween. The cover glass 101 is a member that protects the surface of the display device 1. Instead of the cover glass 101, a protective member, such as a translucent resin substrate and a translucent resin film, may be provided as a cover member of the display device 1. The overcoat layer 98 may be made of transparent ultraviolet (UV)-curing resin having adhesiveness to the cover glass 101. Alternatively, another transparent adhesive layer may be provided to bond the overcoat layer 98 and the cover glass 101.

Figure 9:
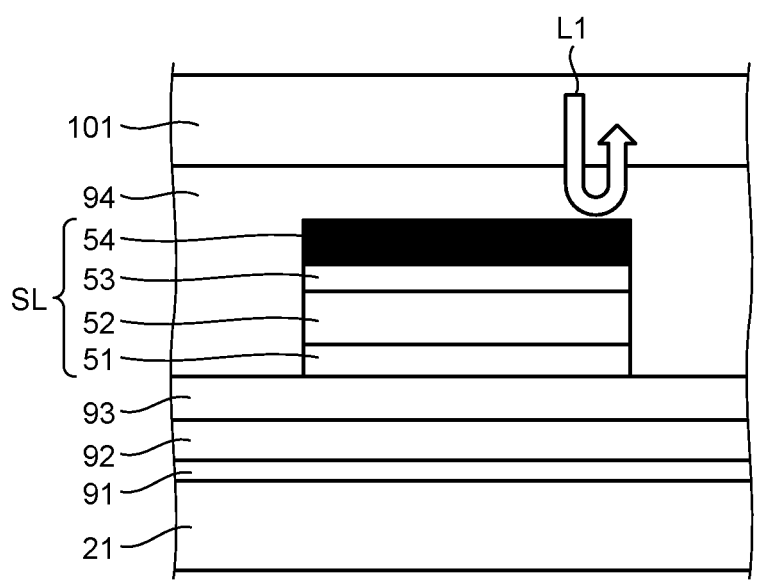
FIG. 9 is a view for explaining a multilayered structure of a signal line.

FIG. 9 is a view for explaining a multilayered structure of the signal line. As illustrated in FIG. 9, the signal line SL includes metal films 51, 52, and 53 and a black member 54. In the signal line SL, the metal films 51, 52, and 53 and the black member 54 are stacked in this order on the interlayer insulating film 93. The black member 54 is provided between the metal film 53 and the cover glass 101.

As described above, the metal films 51 and 53 are made of titanium (Ti), for example. The metal film 52 is made of aluminum (Al), for example. Alternatively, the metal films 51 and 53 may be made of molybdenum (Mo). The thickness of the metal films 51, 52, and 53 is 25 nm to 70 nm, for example. While the signal line SL is formed by stacking three layers of the metal films 51, 52, and 53, it is not limited thereto. The signal line SL may be composed of a single-layer metal film or two- or four-or-more-layer metal films.

The black member 54 is provided on the surface of the metal film 53. The black member 54 is a low-reflective film made of a material having higher light absorbance than the metal films 51, 52, and 53, for example. The black member 54 is made of a black-colored resin material, carbon, or metal oxide, carbide, or metal carbide that shows black due to thin-film interference. The thickness of the black member 54 is 40 nm to 80 nm, for example. Providing the black member 54 can prevent light L1 incident from the first main surface 21A side (cover glass 101 side) of the substrate 21 from being reflected by the surface of the signal line SL. When the light L1 is incident at 90 degrees and is reflected at 90 degrees as an ideal condition, for example, the reflectance in the visible light region of the signal line SL provided with the black member 54 is 10% or lower. As a result, this configuration can prevent light reflected by the signal line SL from being visually recognized by an observer and suppress deterioration of display characteristics due to the reflected light.

If the black member 54 is not provided, rainbow diffraction may possibly occur due to reflection of light by the metal films in the non-translucent regions NCA arrayed in the first direction Dx in the configuration where the translucent regions CA and the non-translucent regions NCA are repeatedly arrayed in the first direction Dx as illustrated in FIGS. 4 and 5. The present embodiment makes the length Px-CA of the translucent region CA in the first direction Dx five or more times the length Px-NCA of the non-translucent region NCA in the first direction Dx. With this configuration, the present embodiment can reduce diffraction efficiency and prevent light from being reflected by the surface of the metal films 51, 52, and 53 using the black member 54. Consequently, the display device 1 can suppress rainbow diffraction, thereby suppressing deterioration of display characteristics.

While FIG. 9 illustrates the multilayered structure of the signal line SL, the gate line GL can also have the same configuration.

Figure 10:
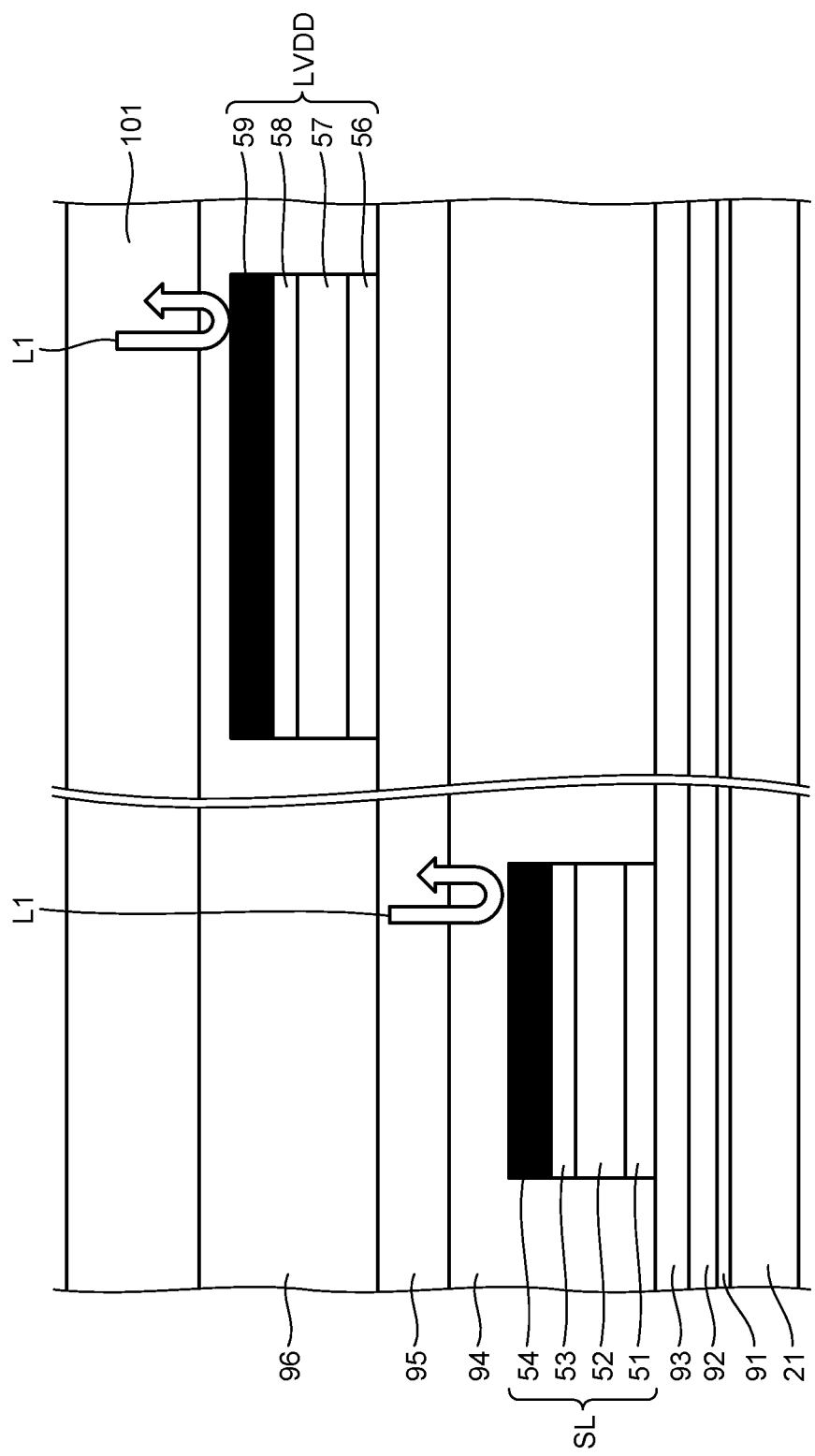
FIG. 10 is a view for explaining multilayered structures of the signal line and an anode power supply line.

FIG. 10 is a view for explaining multilayered structures of the signal line and the anode power supply line. To facilitate the reader's understanding, FIG. 10 illustrates sections of the signal line SL and the anode power supply line LVDD side by side. In other words, FIG. 10 schematically illustrates a sectional view of the signal line SL cut along the first direction Dx and a sectional view of the anode power supply line LVDD cut along the second direction Dy side by side.

As illustrated in FIG. 10, the anode power supply line LVDD includes metal films 56, 57, and 58 and a black member 59. The metal films 56 and 58 are made of titanium (Ti), for example. The metal film 57 is made of aluminum (Al), for example. Alternatively, the metal films 56 and 58 may be made of molybdenum (Mo). The black member 59 is provided on the surface of the metal film 58 and can be made of the same material as that of the black member 54, described above. With this configuration, the anode power supply line LVDD can prevent the light L1 incident from the first main surface 21A side from being reflected.

The width (width in the second direction Dy) of the anode power supply line LVDD is larger than the width (width in the first direction Dx) of the signal line SL. This configuration can reduce the sheet resistance of the anode power supply line LVDD. Consequently, the display device 1 can suppress voltage drop of the anode power supply potential PVDD supplied to the light-emitting elements 3 via the anode power supply line LVDD.

If the black member 59 is made of metal oxide or metal carbide, capacitance formed between the anode power supply line LVDD and nearby wiring is large because the relative permittivity of the black member 59 is higher than that of the metal films 56, 57, and 58. Therefore, the display device 1 can suppress fluctuations in voltage of the anode power supply potential PVDD and stabilize the power supply. The cathode power supply line LVSS can also have the same multilayered structure as that of the anode power supply line LVDD.

Figure 11:
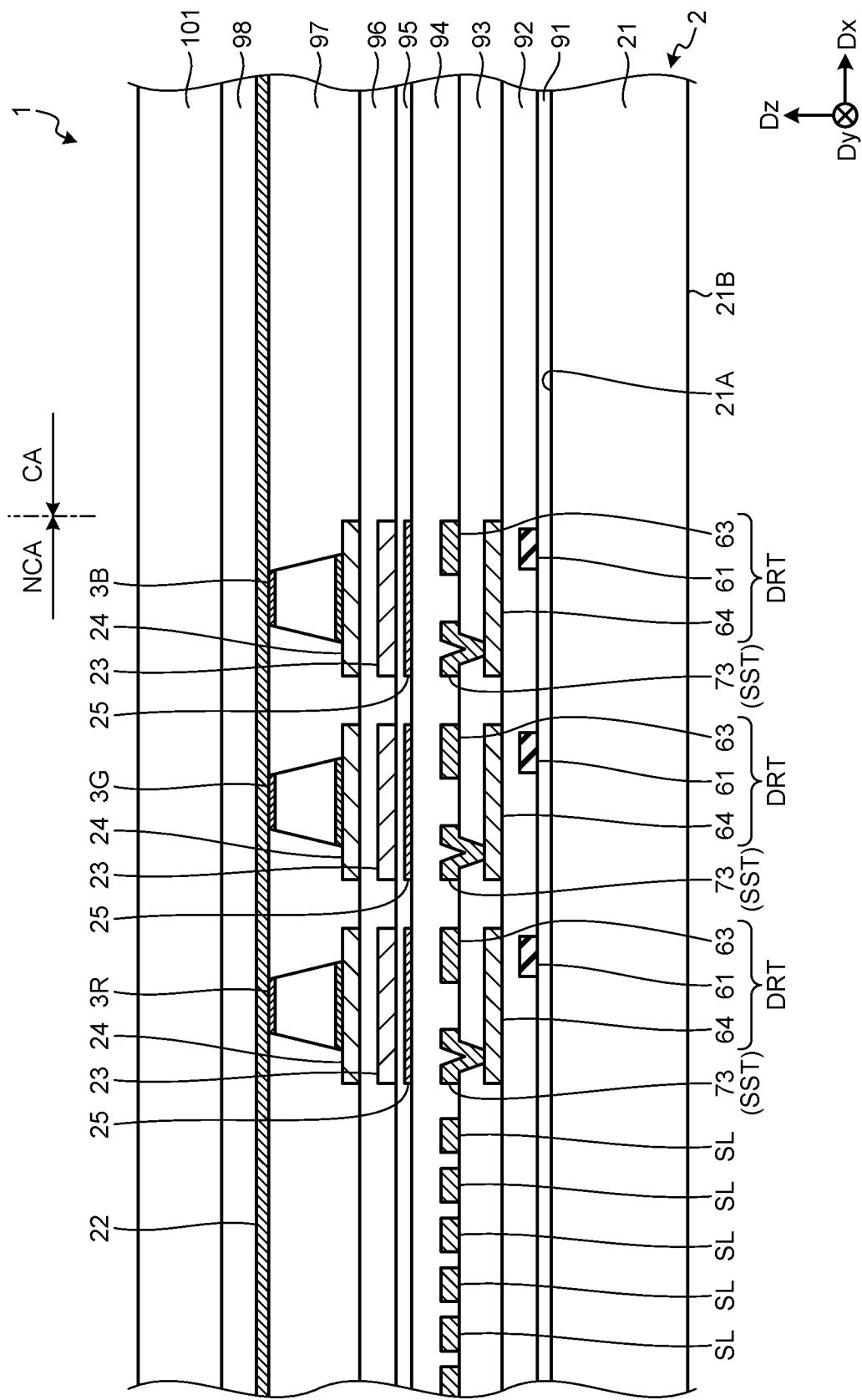
FIG. 11 is a sectional view of a multilayered structure of a translucent region and a non-translucent region.

FIG. 11 is a sectional view of a multilayered structure of the translucent region and the non-translucent region. As illustrated in FIG. 11, the translucent region CA is provided with the translucent insulating films and the cathode electrode 22 that are stacked between the substrate 21 and the cover glass 101. Specifically, in the translucent region CA, the undercoat film 91, the gate insulating film 92, the interlayer insulating film 93, the first organic insulating film 94, the capacitance insulating film 95, the second organic insulating film 96, the element insulating film 97, the cathode electrode 22, the overcoat layer 98, and the cover glass 101 are stacked in this order on the first main surface 21A of the substrate 21. In other words, the translucent region CA is not provided with the transistors (the drive transistors DRT and the writing transistors SST), various kinds of wiring, the anode electrodes 23, or other components provided in the non-translucent region NCA. The insulating films (inorganic and organic insulating films) are continuously provided over the non-translucent region NCA and the translucent region CA.

This configuration can improve light transmittance in the translucent region CA compared with the non-translucent region NCA. The insulating films in the non-translucent region NCA are continuously provided to the translucent region CA. The present embodiment is not limited thereto, and some of the insulating films from the undercoat film 91 to the overcoat layer 98, described above, are not necessarily provided in the translucent region CA. The cathode electrode 22 may be provided in the non-translucent region NCA and is not necessarily provided in the translucent region CA.

As described above, the display device 1 according to the present embodiment includes the substrate 21, a first LED element (e.g., the first light-emitting element 3R of the pixel Pix (2,1)) and a second LED element (e.g., the second light-emitting element 3G of the pixel Pix (1,1)), the first signal line SL-1, the second signal line SL-2, gate wiring (the gate line GL), and anode wiring (the anode power supply line LVDD). The first LED element and the second LED element are provided to the substrate 21 and output light. The first signal line SL-1 is provided between the first LED element and the second LED element and is electrically coupled to the first LED element. The second signal line SL-2 is provided between the first LED element and the second LED element and is electrically coupled to the second LED element. The gate wiring intersects the first signal line SL-1 and the second signal line SL-2. The anode wiring overlaps the gate wiring and is electrically coupled to the first LED element and the second LED element. The anode wiring extends parallel to the gate wiring.

The display device 1 further includes cathode wiring (the cathode power supply line LVSS) overlapping the gate wiring and the anode wiring and electrically coupled to the first LED element and the second LED element. The cathode wiring extends parallel to the gate wiring and the anode wiring.

The display device 1 further includes the cathode electrode 22 and the element insulating film 97. The cathode electrode 22 is coupled to the first LED element and the second LED element in common. The element insulating film 97 surrounds the first LED element and the second LED element between the substrate 21 and the cathode electrode 22. The cathode wiring is positioned between the substrate 21 and the element insulating film 97. The cathode electrode 22 is coupled to the cathode wiring through the contact hole H5 formed in the element insulating film 97. The contact hole H5 overlaps the gate wiring or the anode wiring.

In the display device 1, the anode wiring (anode power supply line LVDD) is positioned between the cathode wiring (cathode power supply line LVSS) and the gate wiring (gate line GL).

The display device 1 further includes a third signal line. The first signal line is provided between the second signal line and the third signal line in the first direction Dx. The third signal line is a signal line SL (e.g., a signal line SL of the pixel Pix (3,1)) in the column next to the first signal line. The first LED element (e.g., the first light-emitting element 3R of the pixel Pix(2,1)) is provided between the first signal line and the third signal line. The distance between the first LED element and the third signal line is five or more times the distance between the first signal line and the first LED element.

First Modification

Figure 12:
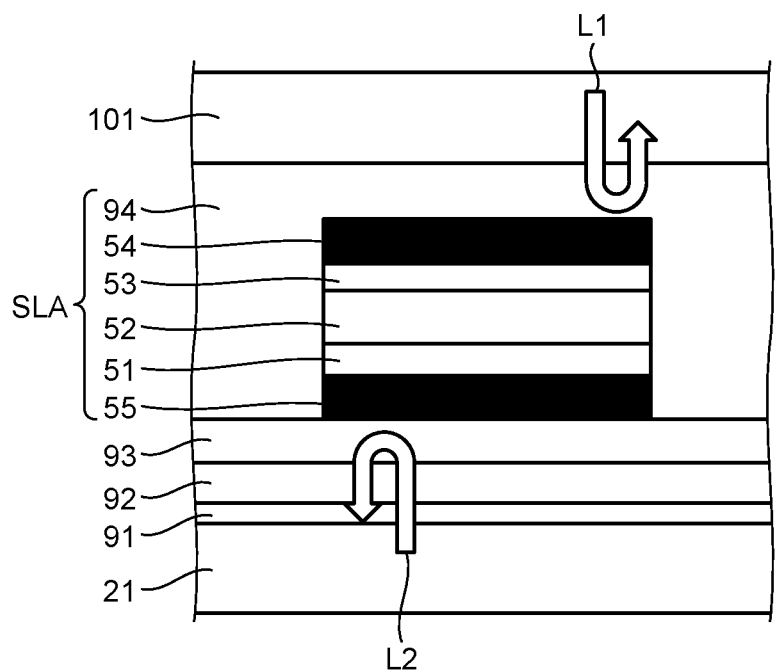
FIG. 12 is a view for explaining a multilayered structure of a signal line according to a first modification.

FIG. 12 is a view for explaining a multilayered structure of a signal line according to a first modification. In the following description, the components described in the embodiment above are denoted by like reference numerals, and explanation thereof is omitted. As illustrated in FIG. 12, a signal line SLA according to the modification includes a black member 55 besides the black member 54. The black members 54 and 55 are provided on the surface and the back surface, respectively, of the metal films 51, 52, and 53. Specifically, in the signal line SLA, the black member 55, the metal films 51, 52, and 53, and the black member 54 are stacked in this order on the interlayer insulating film 93. In other words, the black member 55 is provided between the substrate 21 and the metal film 51.

Providing the black member 55 can prevent light L2 incident from the second main surface 21B side of the substrate 21 from being reflected by the back surface of the signal line SLA. The signal line SLA according to the modification can be used for the display device 1 observed from both the first main surface 21A side (cover glass 101 side) and the second main surface 21B side.

The gate line GL, the anode power supply line LVDD, and the cathode power supply line LVSS can also have the same multilayered structure as that according to the first modification illustrated in FIG. 12. In other words, the gate line GL, the anode power supply line LVDD, and the cathode power supply line LVSS may be provided with the black members 54 and 55 on the surface and the back surface, respectively.

Second Modification

Figure 13:
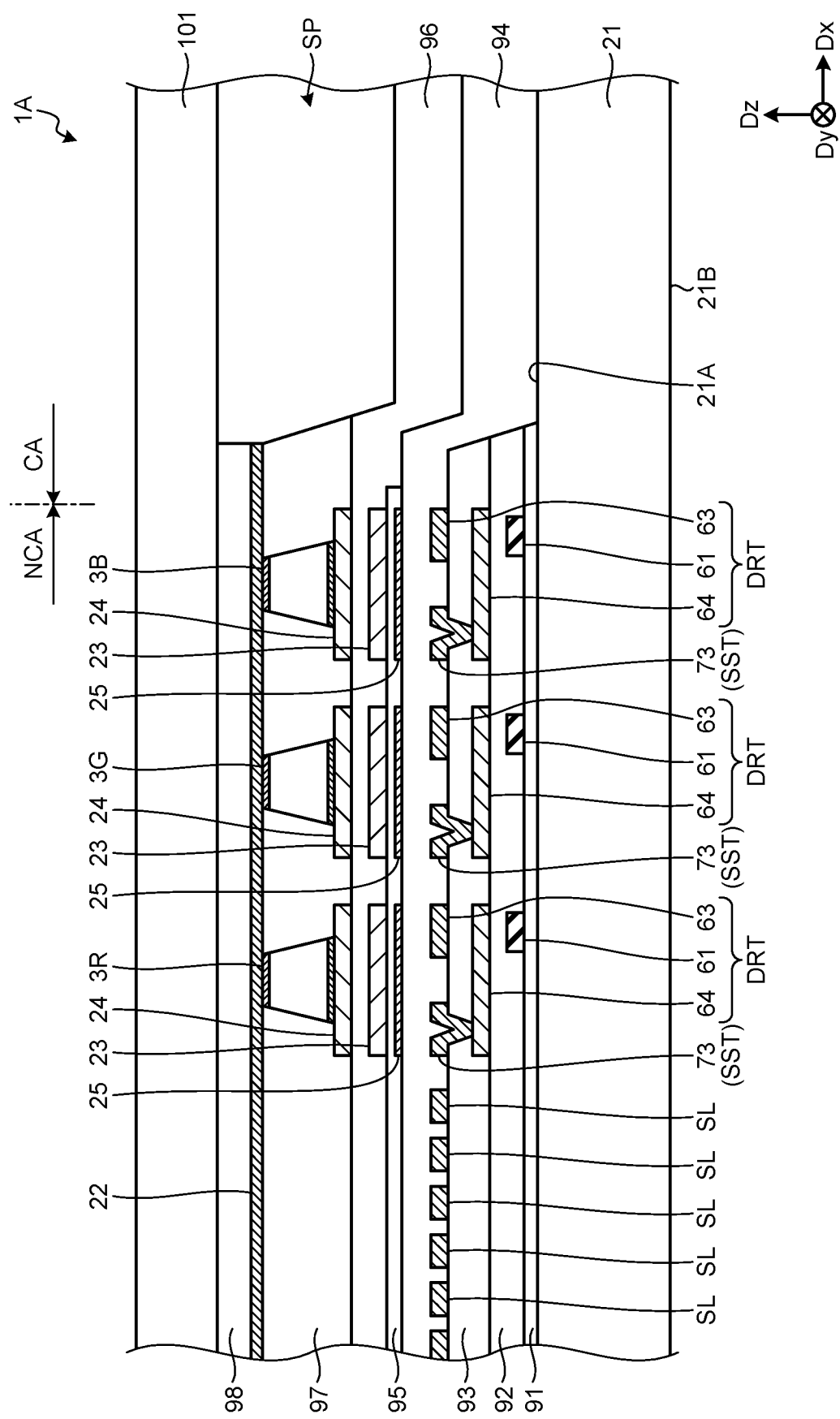
FIG. 13 is a sectional view schematically illustrating a display device according to a second modification.

FIG. 13 is a sectional view schematically illustrating a display device according to a second modification. As illustrated in FIG. 13, in a display device 1A according to the second modification, the translucent region CA is provided with the first organic insulating film 94 and the second organic insulating film 96 stacked on the first main surface 21A of the substrate 21. The cover glass 101 is provided on the second organic insulating film 96 with a space SP formed therebetween.

In other words, the non-translucent region NCA is provided with a plurality of inorganic insulating films (the undercoat film 91, the gate insulating film 92, the interlayer insulating film 93, and the capacitance insulating film 95) and a plurality of organic insulating films (the first organic insulating film 94 and the second organic insulating film 96) stacked between the substrate 21 and the light-emitting elements 3 in the third direction Dz. By contrast, the translucent region CA is not provided with the inorganic insulating films and is provided with the first organic insulating film 94 and the second organic insulating film 96 stacked on the first main surface 21A of the substrate 21.

The distance between the surface of the second organic insulating film 96 (flattening film) and the substrate 21 in the third direction Dz in the translucent region CA is smaller than the distance between the surface of the second organic insulating film 96 (flattening film) and the substrate 21 in the third direction Dz in the non-translucent region NCA. In other words, the total thickness of the insulating films stacked in the translucent region CA is thinner than the total thickness of the insulating films stacked in the non-translucent region NCA. In addition, the translucent region CA is not provided with the element insulating film 97, the cathode electrode 22, and the overcoat layer 98. This configuration can further improve the light transmittance of the translucent region CA.

Third Modification

Figure 14:
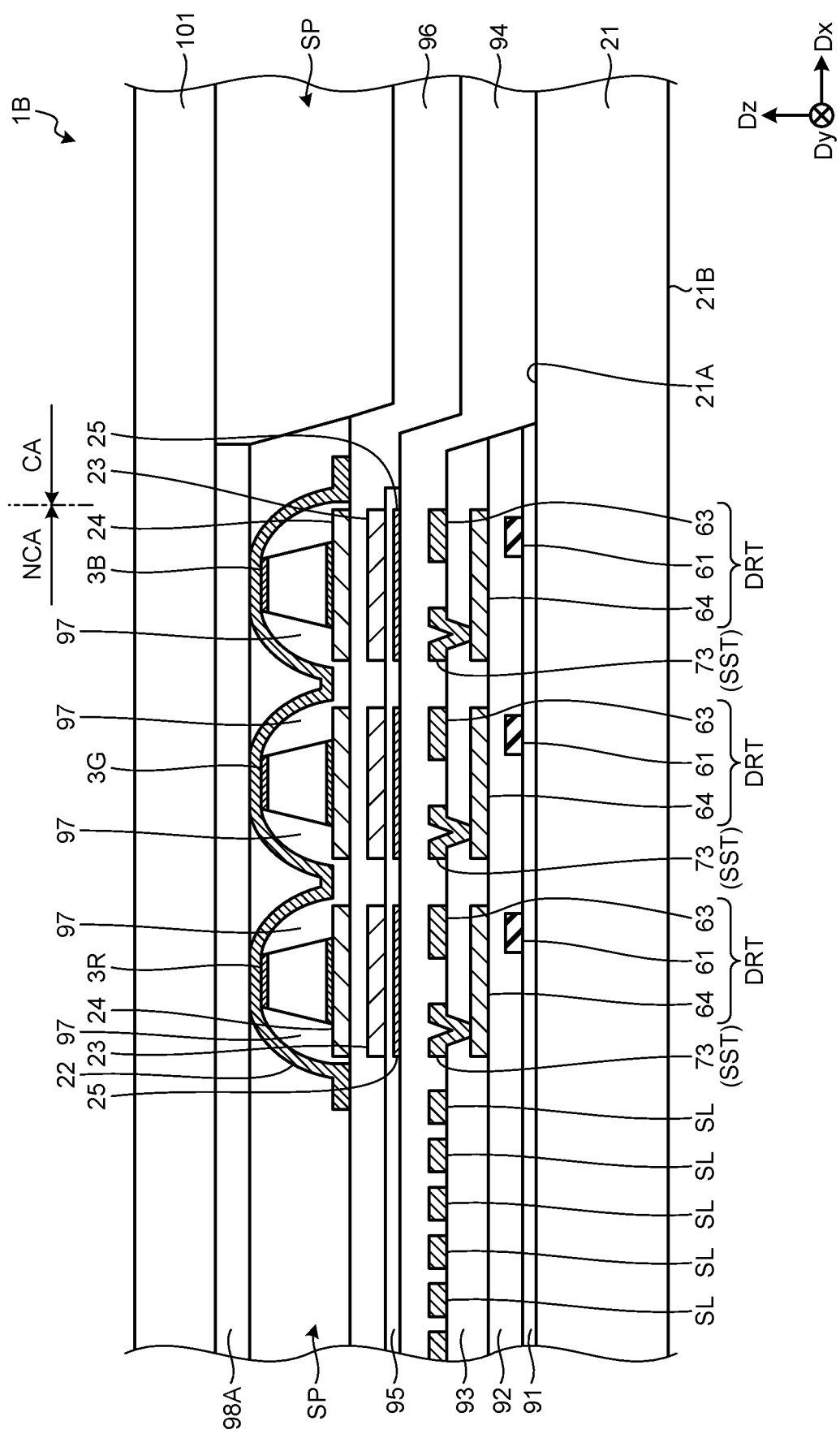
FIG. 14 is a sectional view schematically illustrating a display device according to a third modification.

FIG. 14 is a sectional view schematically illustrating a display device according to a third modification. A display device 1B according to the third modification is different from the first embodiment and the second modification described above in that the element insulating film 97 is provided to each of the light-emitting elements 3. As illustrated in FIG. 14, the element insulating film 97 is provided covering the side surfaces of each light-emitting element 3 and the outer edges of each mounting electrode 24. The element insulating film 97 is formed in a recessed shape between the adjacent light-emitting elements 3. The cathode electrode 22 is provided along the recesses and the protrusions formed by the upper surfaces of the light-emitting elements 3 and the element insulating film 97.

The cover glass 101 is bonded to the upper end of the cathode electrode 22 with an adhesive layer 98A interposed therebetween. The space SP is formed between the cathode electrode 22 and the cover glass 101 between the adjacent light-emitting elements 3. In the region not provided with the light-emitting elements 3 or the element insulating film 97, the space SP is formed between the second organic insulating film 96 and the cover glass 101. Also in this configuration, the element insulating film 97 can provide insulation between the adjacent light-emitting elements 3 and between the adjacent mounting electrodes 24.

Second Embodiment

Figure 15:
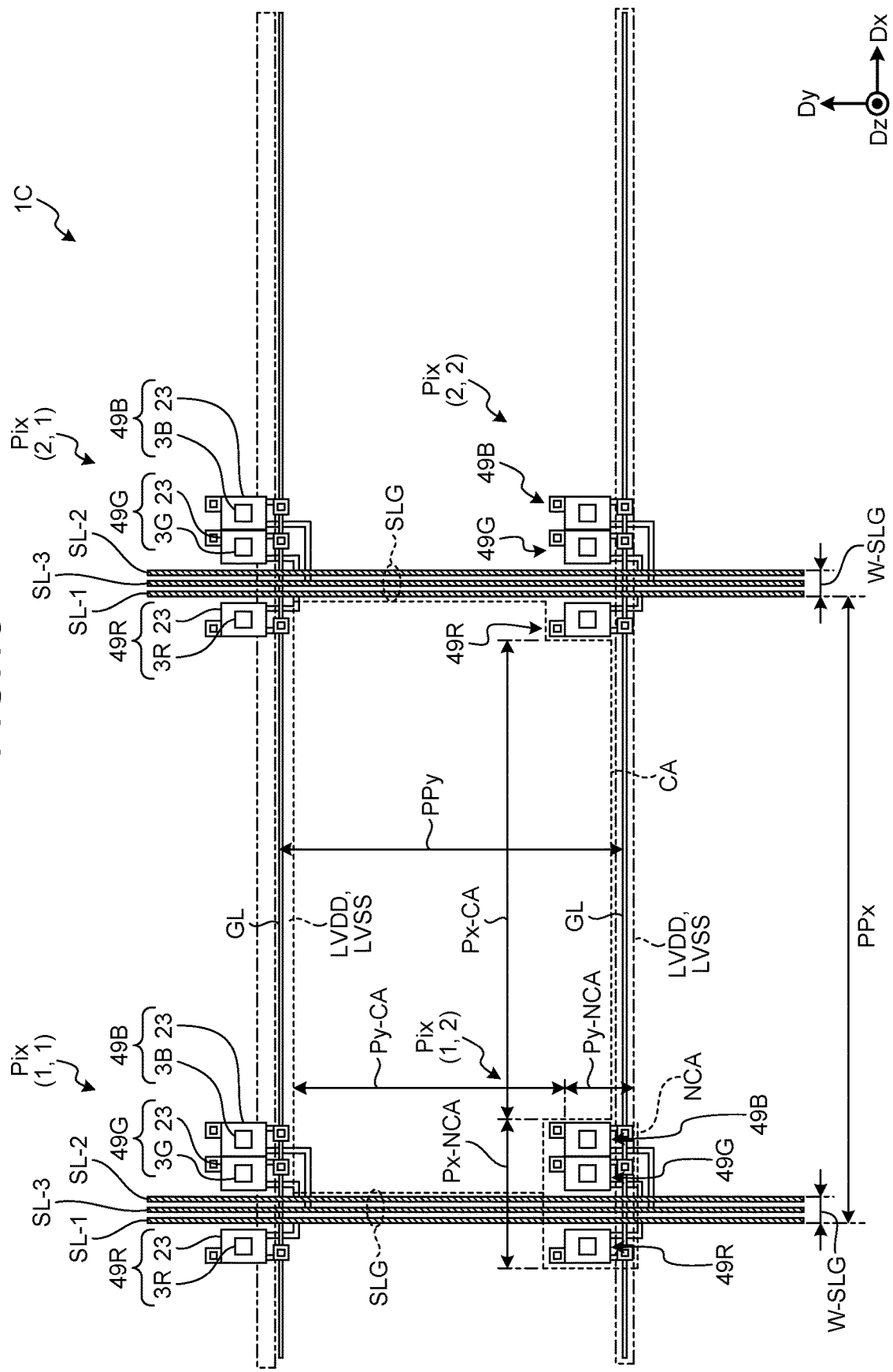
FIG. 15 is a plan view schematically illustrating a plurality of pixels of a display device according to a second embodiment.

FIG. 15 is a plan view schematically illustrating a plurality of pixels of a display device according to a second embodiment. While in the first embodiment above, the configuration has been described in which the light-emitting elements 3 and the signal lines SL are collectively and close in two pixels Pix adjacently disposed in the first direction Dx, the present disclosure is not limited thereto.

FIG. 15 illustrates four pixels Pix in two rows and two columns out of the arrayed pixels Pix. Specifically, as illustrated in FIG. 15, the pixels Pix (1,1) and Pix (2,1) are arrayed in the first direction Dx. Pixels Pix (1,1) and Pix (1,2) are arrayed in the second direction Dy. Pixels Pix (2,1) and Pix (2,2) are arrayed in the second direction Dy.

According to the present embodiment, the pixel Pix corresponds to a region surrounded by two signal line groups SLG adjacently disposed in the first direction Dx and two gate lines GL adjacently disposed in the second direction Dy. The arrangement pitch PPx of the pixels Pix in the first direction Dx is equal to the arrangement pitch of the signal line groups SLG in the first direction Dx. The arrangement pitch PPy of the pixels Pix in the second direction Dy is equal to the arrangement pitch of the gate lines GL adjacently disposed in the second direction Dy.

In a display device 1C according to the second embodiment, a plurality of light-emitting elements 3 and a plurality of signal lines SL are collectively and closely disposed for each pixel Pix. In each pixel Pix, the first light-emitting element 3R, the second light-emitting element 3G, and the third light-emitting element 3B are adjacently disposed in the first direction Dx. Light-emitting element groups (the first light-emitting element 3R, the second light-emitting element 3G, and the third light-emitting element 3B) constituting the respective pixels Pix are disposed apart from each other in the first direction Dx and the second direction Dy.

Figure 16:
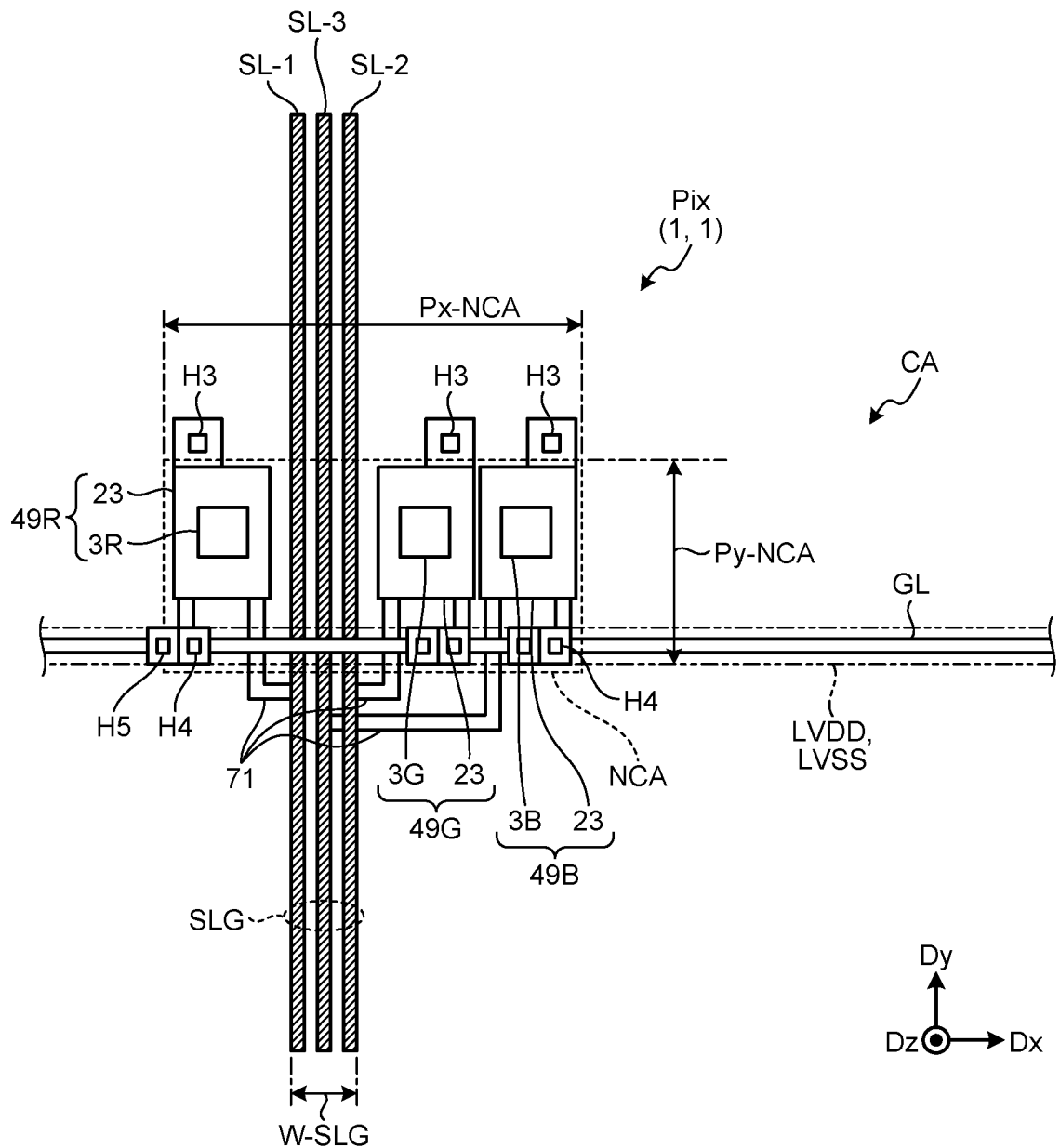
FIG. 16 is an enlarged plan view of one pixel illustrated in FIG. 15.

The following describes a specific example of the configuration of one pixel Pix. FIG. 16 is an enlarged plan view of one pixel illustrated in FIG. 15. While FIG. 16 illustrates the pixel Pix (1,1), the description of the pixel Pix (1,1) is also applicable to other pixels Pix. As illustrated in FIG. 16, the signal line group SLG includes the first signal line SL-1, the second signal line SL-2, and the third signal line SL-3 collectively and adjacently provided in the first direction Dx. The signal line group SLG is coupled to the pixel Pix (1,1).

In the signal line group SLG, the first signal line SL-1, the third signal line SL-3, and the second signal line SL-2 are arrayed in this order in the first direction Dx. The order of arrangement of the signal lines SL in the signal line group SLG can be appropriately changed. The width W-SLG of the signal line group SLG includes the widths of the three signal lines SL and the spaces between the two adjacent signal lines SL. Also in the present embodiment, the width and the space of the signal lines SL are set such that the signal line group SLG forms the non-translucent region NCA.

The first light-emitting element 3R is disposed adjacently to the signal line group SLG in the −Dx direction (left side in FIG. 16). The second light-emitting element 3G and the third light-emitting element 3B are disposed adjacently to the signal line group SLG in the +Dx direction (right side in FIG. 16). In other words, the signal line group SLG is disposed between the first light-emitting element 3R, and the second light-emitting element 3G and the third light-emitting element 3B in the first direction Dx. The first light-emitting element 3R, the second light-emitting element 3G, and the third light-emitting element 3B are disposed adjacently to the gate line GL on the same side (+Dy direction).

The order of arrangement of the light-emitting elements 3 and the signal line group SLG is given by way of example only and may be appropriately changed. The first light-emitting element 3R, for example, may be disposed with one of the second light-emitting element 3G and the third light-emitting element 3B in the −Dx direction of the signal line group SLG, and the other of the second light-emitting element 3G and the third light-emitting element 3B may be disposed in the +Dx direction of the signal line group SLG. Alternatively, the first light-emitting element 3R, the second light-emitting element 3G, and the third light-emitting element 3B may be collectively and closely disposed in the +Dx direction (or −Dx direction) of the signal line group SLG.

The non-translucent region NCA of each pixel Pix corresponds to a region overlapping the first light-emitting element 3R, the second light-emitting element 3G, and the third light-emitting element 3B adjacently disposed in the first direction Dx and the anode electrodes 23 coupled to the respective light-emitting elements 3 and a region including the signal line group SLG.

In the pixel Pix (1,1), the length Px-NCA of the non-translucent region NCA in the first direction Dx is the length from the end of the anode electrode 23 coupled to the first light-emitting element 3R in the first direction Dx (−Dx direction) to the end of the anode electrode 23 coupled to the third light-emitting element 3B in the first direction Dx (+Dx direction) across the signal line group SLG and the second light-emitting element 3G. The width Py-NCA of the non-translucent region NCA in the second direction Dy is the length from the end of the anode electrodes 23 coupled to the respective light-emitting elements 3 in the second direction Dy (+Dy direction) to the end of the anode power supply line LVDD or the cathode power supply line LVSS in the second direction Dy (−Dy direction).

Referring back to FIG. 15, the configuration of the pixels Pix (2,1), Pix (1,2), and Pix (2,2) is the same as that of the pixel Pix (1,1). In other words, a plurality of signal lines SL are bundled and disposed to form the signal line group SLG for each of the pixels Pix arrayed in the first direction Dx, and the light-emitting elements 3 constituting the pixel Pix are disposed closely to the signal line group SLG. The second light-emitting element 3G and the third light-emitting element 3B constituting the pixel Pix (1,1) and the first light-emitting element 3R constituting the pixel Pix (2,1) are disposed apart from each other in the first direction Dx and between two signal line groups SLG adjacently disposed in the first direction Dx. Similarly, the second light-emitting element 3G and the third light-emitting element 3B constituting the pixel Pix (1,2) and the first light-emitting element 3R constituting the pixel Pix (2,2) are disposed apart from each other in the first direction Dx and between two signal line groups SLG adjacently disposed in the first direction Dx.

In other words, the length Px-CA of the translucent region CA in the first direction Dx is equal to the distance between the anode electrodes 23 of the pixels Pix (e.g., the pixels Pix (1,2) and Pix (2,2)) adjacently disposed in the first direction Dx. The length Py-CA of the translucent region CA in the second direction Dy is equal to the distance between the end of the anode electrode 23 of the pixel Pix (e.g., the pixel Pix (1,2)) in the +Dy direction and the power supply line (the anode power supply line LVDD or the cathode power supply line LVSS) of the pixel Pix (e.g., the pixel Pix (1,1)) adjacent thereto in the second direction Dy.

As described above, the light-emitting elements 3 and the signal lines SL are collectively and closely disposed for each pixel Pix. This configuration can also make the length Px-CA of the translucent region CA in the first direction Dx five or more times the length Px-NCA of the non-translucent region NCA in the first direction Dx. This configuration can also make the length Py-CA of the translucent region CA in the second direction Dy five or more times the length Py-NCA of the non-translucent region NCA in the second direction Dy.

Fourth Modification

Figure 17:
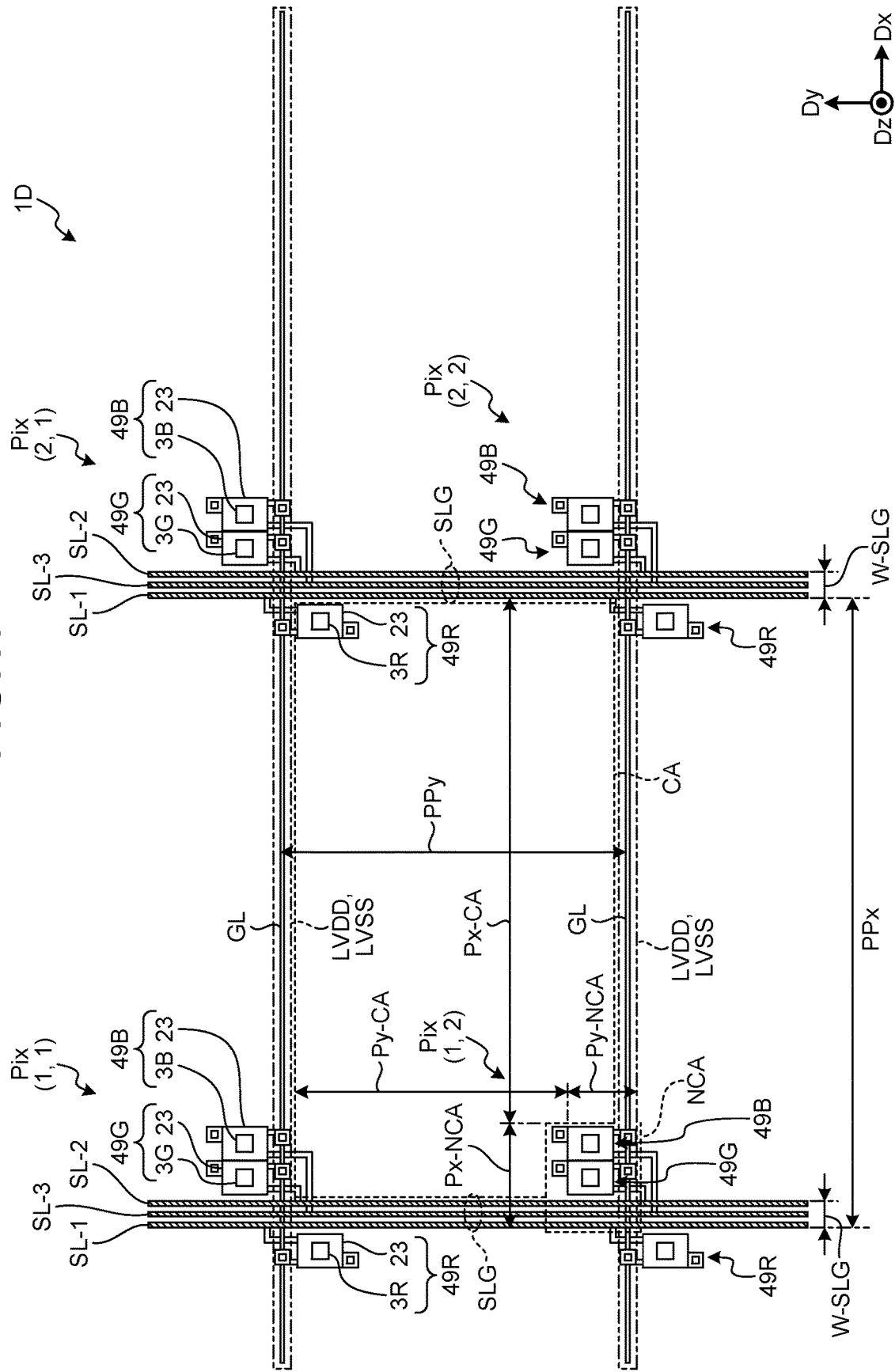
FIG. 17 is a plan view schematically illustrating a plurality of pixels of a display device according to a fourth modification of the second embodiment.
Figure 18:
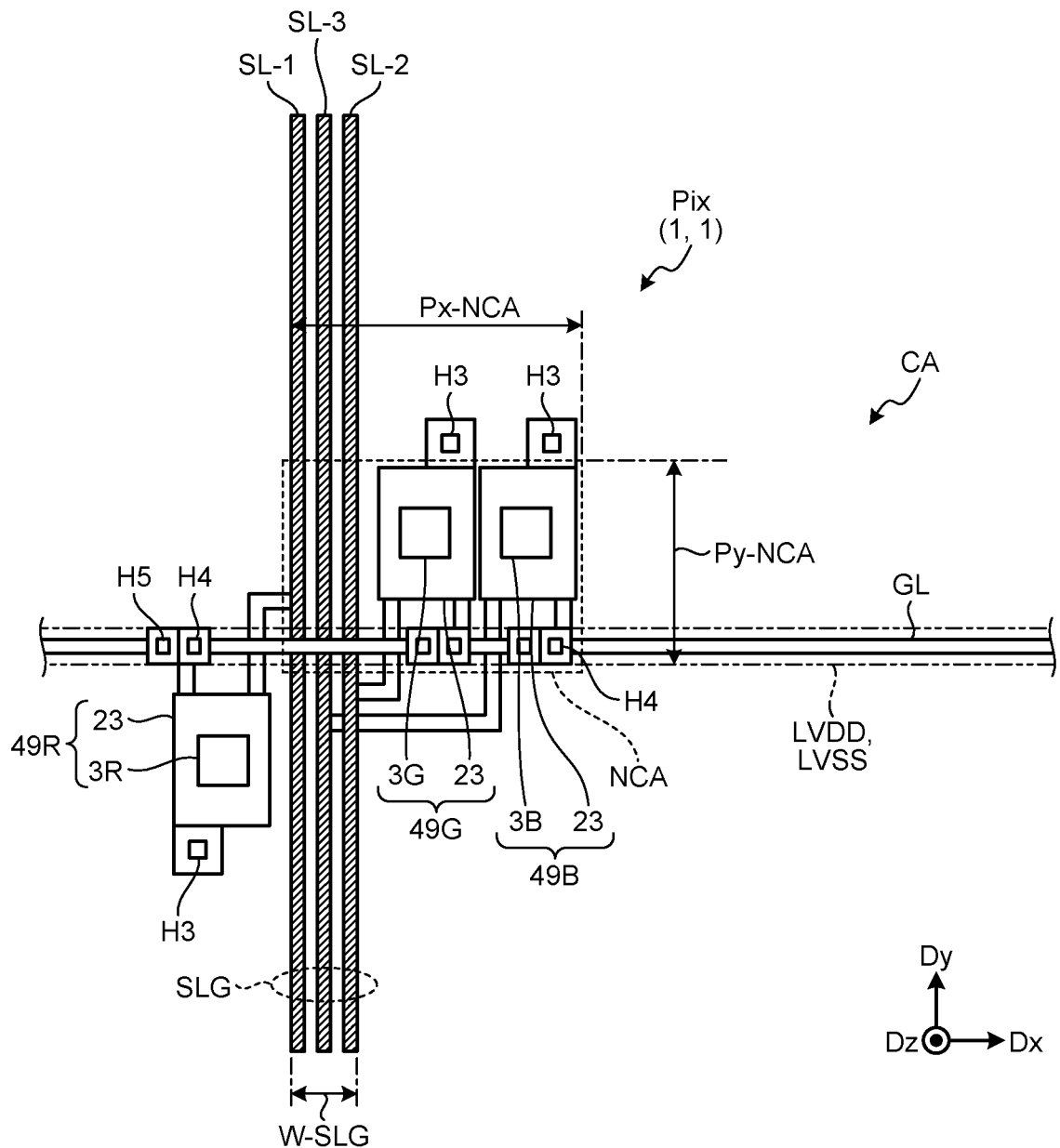
FIG. 18 is an enlarged plan view of one pixel illustrated in FIG. 17.

FIG. 17 is a plan view schematically illustrating a plurality of pixels of a display device according to a fourth modification of the second embodiment. FIG. 18 is an enlarged plan view of one pixel illustrated in FIG. 17. FIG. 18 illustrates the pixel Pix (1,1), for example, in an enlarged manner.

As illustrated in FIGS. 17 and 18, a display device 1D according to the fourth modification is different from the second embodiment described above in that the gate line GL is provided between the first light-emitting element 3R constituting the pixel Pix (1,1) and the second light-emitting element 3G and the third light-emitting element 3B constituting the pixel Pix (1,1) in the second direction Dy. The first light-emitting element 3R is disposed adjacently to the gate line GL in the −Dy direction. The second light-emitting element 3G and the third light-emitting element 3B are disposed adjacently to the gate line GL in the +Dy direction. According to the fourth modification, in one pixel Pix, the first sub-pixel 49R, and the second sub-pixel 49G and the third sub-pixel 49B are different in the configuration of the pixel circuit and various kinds of wiring. The first sub-pixel 49R, and the second sub-pixel 49G and the third sub-pixel 49B, for example, are disposed in such a way that they are inverted with respect to a virtual line serving as the axis of symmetry parallel to the first direction Dx.

The length Px-NCA of the non-translucent region NCA in the first direction Dx is the length from the end of the first signal line SL-1 of the signal line group SLG in the first direction Dx (−Dx direction) to the end of the anode electrode 23 coupled to the third light-emitting element 3B in the first direction Dx (+Dx direction). Similarly to the second embodiment described above, the width Py-NCA of the non-translucent region NCA in the second direction Dy is the length from the end of the anode electrodes 23 coupled to the respective light-emitting elements 3 in the second direction Dy (+Dy direction) to the end of the anode power supply line LVDD or the cathode power supply line LVSS in the second direction Dy (−Dy direction).

In the pixels Pix (e.g., the pixels Pix (1,2) and Pix (2,2)) adjacently disposed in the first direction Dx, the length Px-CA of the translucent region CA in the first direction Dx is equal to the distance between the end of the anode electrode 23 of the pixel Pix (1,2) in the +Dx direction and the end of the signal line group SLG of the pixel Pix (2,2) in the −Dx direction. Similarly to the second embodiment described above, the length Py-CA of the translucent region CA in the second direction Dy is equal to the distance between the end of the anode electrode 23 of the pixel Pix (e.g., the pixel Pix (1,2)) in the +Dy direction and the power supply line (the anode power supply line LVDD or the cathode power supply line LVSS) of the pixel Pix (e.g., the pixel Pix (1,1)) adjacent thereto in the second direction Dy.

As described above, the fourth modification can make the length Px-NCA of the non-translucent region NCA in the first direction Dx smaller and make the length Px-CA of the translucent region CA in the first direction Dx larger than in the second embodiment described above. In other words, the display device 1D can increase the ratio of the length Px-CA of the translucent region CA in the first direction Dx to the length Px-NCA of the non-translucent region NCA in the first direction Dx (Px-CA/Px-NCA). As a result, the display device 1D can improve the light transmittance.

The arrangement relation between the light-emitting elements 3 and the gate line GL is given by way of example only and may be appropriately changed. The first light-emitting element 3R and the second light-emitting element 3G, for example, may be disposed adjacently to the gate line GL in the −Dy direction, and the third light-emitting element 3B may be disposed adjacently to the gate line GL in the +Dy direction.

In the embodiments above, the non-translucent region NCA is illustrated to have a large area relative to the translucent region CA to make the drawings easy to see. Both the length Px-CA in the first direction Dx and the length Py-CA in the second direction Dy of the translucent region CA are sufficiently long and five or more times the lengths of the non-translucent region NCA. The ratio of the arrangement pitch PPx in the first direction Dx and the arrangement pitch PPy in the second direction Dy of the pixels Pix can be appropriately changed depending on the display resolution and the transmittance.

The parts described as the anode terminal 33 and the cathode terminal 32 in the description above are not limited to those described in the present specification and may be opposite depending on the coupling direction of the light-emitting element 3 and the voltage application direction.

While preferred embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modification thereof.

What is claimed is:

1. A display device comprising:
    a substrate;
    a first light-emitting diode (LED) element and a second LED element provided to the substrate and configured to output light;
    a first signal line provided between the first LED element and the second LED element and electrically coupled to the first LED element;
    a second signal line provided between the first LED element and the second LED element and electrically coupled to the second LED element;
    gate wiring intersecting the first signal line and the second signal line;
    anode wiring overlapping the gate wiring and electrically coupled to the first LED element and the second LED element;
    cathode wiring overlapping the gate wiring and the anode wiring and electrically coupled to the first LED element and the second LED element;
    a cathode electrode coupled to the first LED element and the second LED element in common; and
    an element insulating film surrounding the first LED element and the second LED element between the substrate and the cathode electrode,
    wherein
    the gate wiring, a layer including the first signal line and the second signal line, the anode wiring, and the cathode wiring are sequentially stacked on the substrate,
    the anode wiring extends parallel to the gate wiring,
    the cathode wiring extends parallel to the gate wiring and the anode wiring,
    the cathode wiring is positioned between the substrate and the element insulating film, the cathode electrode is coupled to the cathode wiring through a contact hole formed in the element insulating film, and the contact hole overlaps the gate wiring or the anode wiring.

2. The display device according to claim 1, wherein the anode wiring is positioned between the cathode wiring and the gate wiring.

3. The display device according to claim 1, further comprising a third signal line, wherein the first signal line is provided between the second signal line and the third signal line in a first direction, the third signal line is disposed in the same layer of the first signal line and the second signal line, the third signal line is a signal line in a column next to the first signal line, the first LED element is provided between the first signal line and the third signal line, and a distance between the first LED element and the third signal line is five or more times a distance between the first signal line and the first LED element.

4. A display device comprising:

a substrate;

a plurality of pixels provided to the substrate, each of the pixels has a translucent region and a non-translucent region;

a plurality of light-emitting elements provided to the pixels and configured to output light;

a plurality of transistors provided corresponding to the light-emitting elements; and a signal line and a gate line coupled to the transistors, wherein one of the transistors overlaps the gate line, the gate line and the signal line are stacked sequentially on the substrate, the translucent region with an aperture ratio of 80% or higher and the non-translucent region with an aperture ratio of lower than 80% are adjacently formed in a first direction, and a length of the translucent region in the first direction is five or more times a length of the non-translucent region in the first direction.

5. The display device according to claim 4, wherein the non-translucent region includes a region overlapping the light-emitting elements, an anode electrode coupled to the light-emitting elements, the signal line, and the gate line, and the anode electrode is disposed in a same layer as the anode wiring.

6. The display device according to claim 4, further comprising a signal line group including a plurality of the signal lines adjacently disposed in the first direction, wherein the light-emitting elements are electrically coupled to the respective signal lines of the signal line group, the signal line group is disposed over the gate wiring, and the signal line group and the light-emitting elements are adjacently disposed in the first direction to form the non-translucent region extending continuously in the first direction.

7. The display device according to claim 4, further comprising a signal line group including a first signal line, a second signal line, and a third signal line adjacently provided in the first direction, wherein the light-emitting elements include a first light-emitting element electrically coupled to the first signal line, a second light-emitting element electrically coupled to the second signal line, and a third light-emitting element electrically coupled to the third signal line, the signal line group is disposed over the gate wiring, and the signal line group is disposed between the first light-emitting element and at least one of the second light-emitting element and the third light-emitting element in the first direction.

8. The display device according to claim 7, wherein the first light-emitting element, the second light-emitting element, and the third light-emitting element are disposed adjacently to the gate line intersecting the signal line group on one side in a second direction intersecting the first direction.

9. The display device according to claim 7, wherein the first light-emitting element is disposed adjacently to the gate line intersecting the signal line group on one side in a second direction intersecting the first direction, and at least one of the second light-emitting element and the third light-emitting element is disposed adjacently to the gate line on another side in the second direction.

10. The display device according to claim 4, further comprising a signal line group in which a plurality of the signal lines coupled to a first pixel and a plurality of the signal lines coupled to a second pixel disposed adjacently to the first pixel are adjacently provided in the first direction, wherein the signal line group is disposed between the light-emitting elements constituting the first pixel and the light-emitting elements constituting the second pixel in the first direction.

11. The display device according to claim 10, wherein the light-emitting elements constituting the first pixel are disposed adjacently to the gate line intersecting the signal line group on one side in a second direction intersecting the first direction, and the light-emitting elements constituting the second pixel are disposed adjacently to the gate line on another side in the second direction.

12. The display device according to claim 4, wherein at least one of the signal line and the gate line comprises a metal film and a black member provided to a surface of the metal film.

13. The display device according to claim 12, wherein the black member is provided to a surface and a back surface of the metal film of at least one of the signal line and the gate line.

14. The display device according to claim 4, further comprising a power supply line configured to supply a power supply potential to the light-emitting elements, wherein the power supply line is provided overlapping the gate line, and the power supply line comprises a metal film and a black member provided to a surface of the metal film.

15. The display device according to claim 4, wherein the non-translucent region is provided with a plurality of inorganic insulating films and a plurality of organic insulating films stacked between the substrate and the light-emitting elements in a direction perpendicular to the substrate, and the translucent region is not provided with the inorganic insulating films and is provided with the organic insulating films stacked in the direction perpendicular to the substrate.

16. The display device according to claim 15, wherein the organic insulating films include a flattening film provided with the light-emitting elements, and a distance between a surface of the flattening film and the substrate in the direction perpendicular to the substrate in the translucent region is smaller than a distance between the surface of the flattening film and the substrate in the direction perpendicular to the substrate in the non-translucent region.

\* \* \* \* \*